United States Patent
Fan et al.

(10) Patent No.: US 11,568,123 B2
(45) Date of Patent: Jan. 31, 2023

(54) METHOD FOR DETERMINING AN ETCH PROFILE OF A LAYER OF A WAFER FOR A SIMULATION SYSTEM

(71) Applicant: ASML NETHERLANDS B.V., Veldhoven (NL)

(72) Inventors: Chi-Hsiang Fan, San Jose, CA (US); Feng Chen, San Jose, CA (US); Wangshi Zhao, San Jose, CA (US); Youping Zhang, Cupertino, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/157,642

(22) Filed: Jan. 25, 2021

(65) Prior Publication Data

US 2021/0150116 A1    May 20, 2021

Related U.S. Application Data

(63) Continuation-in-part of application No. PCT/EP2019/069460, filed on Jul. 19, 2019.
(Continued)

(51) Int. Cl.
*G06F 30/398* (2020.01)
*G03F 1/36* (2012.01)

(52) U.S. Cl.
CPC .............. *G06F 30/398* (2020.01); *G03F 1/36* (2013.01)

(58) Field of Classification Search
CPC .... G03F 7/70625; G03F 7/70633; G03F 1/36; G03F 7/705; G03F 7/706; G03F 7/70641;
(Continued)

(56) References Cited

U.S. PATENT DOCUMENTS

| 5,421,934 A | 6/1995 | Misaka et al. |
| 6,046,792 A | 4/2000 | Van Der Werf et al. |

(Continued)

FOREIGN PATENT DOCUMENTS

| CN | 103020349 | 4/2013 |
| KR | 1020170074777 | 6/2017 |

(Continued)

OTHER PUBLICATIONS

International Search Report and Written Opinion issued in corresponding PCT Patent Application No. PCT/EP2019/069460, dated Nov. 27, 2019.
(Continued)

*Primary Examiner* — Binh C Tat
(74) *Attorney, Agent, or Firm* — Pillsbury Winthrop Shaw Pittman LLP

(57) ABSTRACT

A method for determining an etch profile is described. The method includes determining a masking layer profile. Loading information can be determined. The loading information indicates dependence of an etch rate for the masking layer profile on a quantity and pattern of material being etched. Flux information can be determined. The flux information indicates dependence of the etch rate on an intensity and a spread angle of radiation incident on the masking layer profile. Re-deposition information can be determined. The re-deposition information indicates dependence of the etch rate on an amount of material removed from the masking layer profile that is re-deposited back on the masking layer profile. An output etch profile for the layer of the wafer is determined based on the loading information, the flux information, and/or the re-deposition information.

20 Claims, 16 Drawing Sheets

Related U.S. Application Data

(60) Provisional application No. 62/703,529, filed on Jul. 26, 2018.

(58) Field of Classification Search
CPC ............ G03F 7/70683; G03F 7/70441; G03F 7/70616; G03F 1/44; G03F 1/84; G03F 7/70466; G03F 7/70525; G03F 1/68; G03F 7/70433; G03F 7/70608; G03F 7/0035; G03F 7/70283; G03F 7/70425; G03F 1/26; G03F 1/70; G03F 1/72; G03F 7/704; G03F 7/70558; G03F 7/7065; G03F 7/70783; G03F 9/7026; G03F 1/38; G03F 7/203; G03F 7/40; G03F 7/70291; G03F 7/70675; G03F 7/70691; G03F 7/70258; G03F 7/70333; G03F 7/70341; G03F 7/70458; G03F 7/70891; G03F 9/7046; G03F 9/7076; G03F 1/32; G03F 1/62; G03F 1/78; G03F 7/091; G03F 7/2022; G03F 7/2051; G03F 7/26; G03F 7/38; G03F 7/70108; G03F 7/7015; G03F 7/70158; G03F 7/70383; G03F 7/70491; G03F 7/70516; G03F 7/70566; G03F 7/70658; G03F 7/707; G03F 7/70708; G03F 7/70991; G03F 9/7065; G03F 9/708; G03F 7/7085; G03F 7/0508; G03F 9/7003; G03F 9/7088; G03F 7/70575; G03F 7/70191; G03F 9/7049; G03F 7/70058; G03F 7/70133; G03F 7/2004; G03F 9/7019; G03F 7/70141; G03F 7/70483; G03F 9/7092; G03F 7/20; G03F 9/7034; G03F 7/2002; G03F 7/70091; G03F 7/702; G03F 7/0425; G03F 9/70; G03F 7/708; G03F 7/7005; G03F 7/0108; G03F 7/0283; G03F 7/0316; G03F 7/70775; G03F 7/70866; G03F 9/7011; G03F 9/7023; G03F 7/026; G03F 9/7042; G03F 9/7073; G03F 9/7096; G03F 1/50; G03F 1/76; G03F 7/2043; G03F 7/10; G03F 7/70083; G03F 7/0266; G03F 7/70325; G03F 7/70358; G03F 7/7055; G03F 7/70725; G03F 9/7084; G03F 1/22; G03F 1/24; G03F 1/52; G03F 1/74; G03F 2007/2067; G03F 7/0392; G03F 7/2039; G03F 7/70008; G03F 7/70025; G03F 7/70033; G03F 7/70075; G03F 1/42; G03F 7/70041; G03F 7/70116; G03F 7/70533; G03F 7/70666; G06F 30/20; G06F 30/39; G06F 30/398; G06F 2119/18; G06F 30/333; G06F 30/00; G06F 2111/10; G06F 30/30; G06F 17/18; G06F 30/33; G06F 17/12; G06F 2119/22; G06F 30/337; G06F 30/392; G06F 30/367; G06F 11/079; G06F 2119/02; G06F 30/10; G06F 30/27; G01B 11/02; H01L 21/0274; H01L 21/67213
USPC ..................................................... 716/50–56
See application file for complete search history.

(56) References Cited

U.S. PATENT DOCUMENTS

| | | | |
|---|---|---|---|
| 6,961,116 | B2 | 11/2005 | Den Boef et al. |
| 7,587,704 | B2 | 9/2009 | Ye et al. |
| 7,849,423 | B1 | 12/2010 | Yenikaya et al. |
| 7,962,866 | B2 | 6/2011 | White et al. |
| 9,792,393 | B2 | 10/2017 | Tetiker et al. |
| 9,978,934 | B2 | 5/2018 | Paranjpe et al. |
| 10,825,680 | B2 | 11/2020 | Kabansky et al. |
| 10,969,697 | B1 * | 4/2021 | Hsieh .................. G03F 7/70683 |
| 2005/0278060 | A1 | 12/2005 | Furuya |
| 2006/0066855 | A1 | 3/2006 | Boef et al. |
| 2008/0081482 | A1 | 4/2008 | Brcka et al. |
| 2009/0055143 | A1 | 2/2009 | Ichikawa et al. |
| 2009/0157360 | A1 | 6/2009 | Ye et al. |
| 2009/0242513 | A1 | 10/2009 | Funk et al. |
| 2011/0027704 | A1 | 2/2011 | Cramer et al. |
| 2011/0043791 | A1 | 2/2011 | Smilde et al. |
| 2011/0082577 | A1 | 4/2011 | Kuboi et al. |
| 2012/0242970 | A1 | 9/2012 | Smilde et al. |
| 2014/0282302 | A1 | 9/2014 | Greiner et al. |
| 2014/0282324 | A1 | 9/2014 | Greiner et al. |
| 2015/0213176 | A1 | 7/2015 | Greiner et al. |
| 2015/0227650 | A1 | 8/2015 | Song et al. |
| 2015/0346605 | A1 * | 12/2015 | Den Boef ............. H01L 23/544 |
| | | | 716/51 |
| 2017/0147724 | A1 | 5/2017 | Regli et al. |
| 2017/0176983 | A1 | 6/2017 | Tetiker et al. |
| 2017/0228482 | A1 | 8/2017 | Tetiker et al. |
| 2017/0363950 | A1 | 12/2017 | Sriraman et al. |
| 2018/0129140 | A1 * | 5/2018 | Cramer ............... G03F 7/70633 |
| 2019/0049937 | A1 | 2/2019 | Tetiker et al. |

FOREIGN PATENT DOCUMENTS

| | | |
|---|---|---|
| WO | 2009078708 | 6/2009 |
| WO | 2009106279 | 9/2009 |
| WO | 2020020759 | 1/2020 |

OTHER PUBLICATIONS

Korean Office Action issued in corresponding Korean Patent Application No. 10-2021-7002624, dated Sep. 22, 2022.

* cited by examiner

METHOD FOR DETERMINING AN ETCH PROFILE OF A LAYER OF A WAFER FOR A SIMULATION SYSTEM This application is a continuation-in-part of PCT Patent Application No. PCT/EP2019/069460, filed on Jul. 19, 2019, which claims the benefit of priority of U.S. Patent Application No. 62/703,529, which was filed on Jul. 26, 2018, each of the foregoing applications is incorporated herein in its entirety by reference.

TECHNICAL FIELD

The description herein relates generally to mask manufacturing and patterning processes. More particularly, the description relates to an apparatus and a method for determining an etch profile of a layer of a wafer for a simulation system.

BACKGROUND

A lithographic projection apparatus can be used, for example, in the manufacture of integrated circuits (ICs). In such a case, a patterning device (e.g., a mask) may contain or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatuses, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

Prior to transferring the pattern from the patterning device to the substrate, the substrate may undergo various procedures, such as priming, resist coating, and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-k1 lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

According to an embodiment, a method for determining an etch profile of a layer of a wafer for a simulation system is provided. The method comprises determining a starting masking layer profile for the layer of the wafer. The method comprises, based at least in part on the masking layer profile, determining loading information for the masking layer profile. The loading information indicates dependence of an etch rate for the masking layer profile on a quantity and pattern of material being etched. The method comprises, based at least in part on the masking layer profile, determining flux information for the masking layer profile. The flux information indicates dependence of the etch rate for the masking layer profile on an intensity and a spread angle of radiation incident on the masking layer profile. The method comprises, based at least in part on the masking layer profile, determining re-deposition information for the masking layer profile. The re-deposition information indicates dependence of the etch rate for the masking layer profile on an amount of material removed from the masking layer profile that is re-deposited back on the masking layer profile. The method comprises determining an output etch profile for the layer of the wafer based on the loading information, the flux information, and/or the re-deposition information for the masking layer profile.

In an embodiment, the method further comprises determining depth information based on the output etch profile for use during overlay determination.

In an embodiment, determining the loading information, determining the flux information, determining the re-deposition information, and/or determining the output etch profile are performed iteratively until the depth information corresponds to depths in an image of a corresponding layer of a physical wafer.

In an embodiment, the method further comprises generating an electronic depiction of the layer of the wafer based on the depth information to facilitate a visual comparison between the electronic depiction and the image of the corresponding layer of the physical wafer.

In an embodiment, the method further comprises generating an electronic depiction of the layer of the wafer based on the depth information to facilitate dimensional measurement of the electronic depiction for comparison to dimensions obtained from the image of the corresponding layer of the physical wafer.

In an embodiment, the method further comprises calibrating parameters of operations of the method based on information from a metrology system for a corresponding layer of a physical and/or a simulated wafer. For example, the calibration may involve tuning the parameters by minimizing a difference between output of metrology system on physical wafer (measurement) and output of simulated metrology output on simulated wafer. The metrology system may be, for example an SEM (explained in greater detail below) or a scatterometry system (optical tools).

In an embodiment, the method further comprises calibrating parameters of operations of the method based on information from the metrology system for the corresponding layer of the simulated wafer, and the calibration further comprises adjusting wafer simulation parameters of the simulated wafer. Stated another way, the calibration may involve further tuning the parameters of the model that determine the masking layer profile. For example, the masking layer may be a photoresist layer and the system that determines the masking layer may be a lithography model, and the parameters are the those for the lithography model (explained in greater detail below).

In an embodiment, determining the masking layer profile, determining the loading information, determining the flux information, determining the re-deposition information, and/or determining the output etch profile are performed for a region of interest of the layer of the wafer.

In an embodiment, the masking layer profile for the layer of the wafer comprises an after patterning profile.

In an embodiment, the masking layer profile for the layer of the wafer comprises after develop inspection (ADI) dimensions.

In an embodiment, determining the masking layer profile for the layer of the wafer comprises one or more of obtaining, designing, or measuring dimensions of the masking layer profile.

In an embodiment, the method further comprises simulating a trim operation on the masking layer profile according to a trim recipe. Simulating the trim operation on the masking layer profile may comprise modifying dimensions of the masking layer profile.

In an embodiment, simulating the trim operation on the masking layer profile comprises adjusting a mask critical dimension (CD) offset.

In an embodiment, determining the loading information for the masking layer profile comprises adjusting one or more of an etch rate constant, a short range loading factor, or a long range loading factor.

In an embodiment, determining the flux information for the masking layer profile comprises adjusting one or more of an ion intensity, a neutral intensity, or a spread angle of the incident radiation.

In an embodiment, determining the re-deposition information for the masking layer profile comprises adjusting a re-deposition rate for the masking layer profile.

In an embodiment, determining the loading information comprises determining dependence of the etch rate at individual locations across the masking layer profile on a quantity and pattern of material being etched at the individual locations; determining the flux information comprises determining dependence of the etch rate at the individual locations across the masking layer profile on an intensity and a spread angle of radiation incident on the masking layer profile at the individual locations; and determining the re-deposition information comprises determining the dependence of the etch rate at the individual locations across the masking layer profile on an amount of material removed from the masking layer profile at the individual locations that is re-deposited back on the masking layer profile at the individual locations.

In an embodiment, determining the dependence of the etch rate at the individual locations across the masking layer profile comprises determining individual loading factors for the individual locations.

In an embodiment, an individual loading factor is determined based on a Boolean function of a mask pattern at an individual location.

In an embodiment, the flux information is determined based on one or more bias constants, one or more fitting constants, short range loading factors, and long range loading factors that correspond to individual locations.

In an embodiment, the re-deposition information is determined based on one or more bias constants, long range fitting factors, and long range loading factors that correspond to individual locations.

According to another embodiment, a computer program product is provided. The computer program product comprises a non-transitory computer readable medium having instructions recorded thereon, the instructions when executed by a computer implementing the method described above.

According to another embodiment, a method for etch model application to generate a metrology target design is provided. The method comprises calibrating the etch model using experimental cross-section profile information from a layer of a physical wafer generated based on the etch model. The method comprises predicting an etch depth profile of a layer of a modeled wafer based on the calibrated etch model. The method comprises using the predicted etch depth profile in rigorous coupled-wave analysis (RCWA) to enhance the metrology target design.

In an embodiment, predicting the etch depth profile of the layer of the modeled wafer based on the calibrated etch model comprises: determining (i) a starting resist profile for the layer of the wafer and (ii) a resist trim etching recipe; determining a trimmed resist profile by simulating a trim operation on the starting resist profile according to the resist trim etching recipe, based at least in part on the trimmed resist profile: determining loading information for the trimmed resist profile, the loading information indicating dependence of an etch rate for the trimmed resist profile on a quantity and pattern of material being etched; and/or determining flux information for the trimmed resist profile, the flux information indicating dependence of the etch rate for the trimmed resist profile on an intensity and a spread angle of radiation incident on the trimmed resist profile; and/or determining re-deposition information for the trimmed resist profile, the re-deposition information indicating dependence of the etch rate for the trimmed resist profile on an amount of material removed from the trimmed resist profile that is re-deposited back on the trimmed resist profile; and determining an output etch depth profile for the layer of the wafer based on the loading information, the flux information, and/or the re-deposition information for the trimmed resist profile.

In an embodiment, enhancing the metrology target design comprises adjusting one or more dimensions and/or a pattern of the metrology target design.

In an embodiment, the experimental cross-section profile information comprises visual or dimensional comparisons between an electronic image of the layer of the physical wafer and a corresponding electronic depiction of the layer generated using the model.

According to another embodiment, a computer program product is provided. The computer program product comprises a non-transitory computer readable medium having instructions recorded thereon, the instructions when executed by a computer implementing the method described immediately above.

According to another embodiment, a method for etch model application to calibrate a two dimension etch model for optical proximity correction (OPC) applications is provided. The method comprises calibrating the etch model using any combination of cross-section profile, SEM, and scatterometry (e.g., using optical tools) measurements from a layer of a simulated wafer generated based on the etch process. The method comprises predicting the etch biases of a plurality of patterns in a layer of a modeled wafer based on the calibrated etch model. The method comprises using the predicted etch biases to correct a photomask (e.g., OPC application), verify the post-etch process window (OPC verification or lithography manufacturability check (LMC)), or co-optimize the lithography source and photomask (e.g., using a source mask optimization (SMO) application).

According to another embodiment, a computer program product is provided. The computer program product comprises a non-transitory computer readable medium having instructions recorded thereon, the instructions when executed by a computer implementing the method described immediately above.

According to another embodiment, a method for etch model application to calibrate an etch model for predicting a cross-wafer etch fingerprint as input to wafer inspection or patterning control operations is provided. The method comprises calibrating the etch model with parameters that describe cross wafer variations of the etch process, using any combination of a cross-wafer cross-section profile, SEM, and scatterometry measurements from a layer of a simulated wafer generated based on the etch process. The method comprises predicting the etch bias of a plurality of patterns of a layer of a modeled wafer based on the calibrated etch model. The method comprises using the predicted etch bias fingerprint as input for defect prediction of an inspection system (e.g., a guided wafer defect inspection application such as a pattern fidelity metrology (PFM) application), or to a wafer manufacturing process control system (e.g., a pattern fidelity control (PFC) system) to improve across wafer patterning performance (e.g., using a wafer manufacturing process control application).

According to another embodiment, a computer program product is provided. The computer program product comprises a non-transitory computer readable medium having instructions recorded thereon, the instructions when executed by a computer implementing the method described immediately above.

BRIEF DESCRIPTION OF THE DRAWINGS

The above aspects and other aspects and features will become apparent to those ordinarily skilled in the art upon review of the following description of specific embodiments in conjunction with the accompanying figures, wherein.

DETAILED DESCRIPTION

Figure 1:
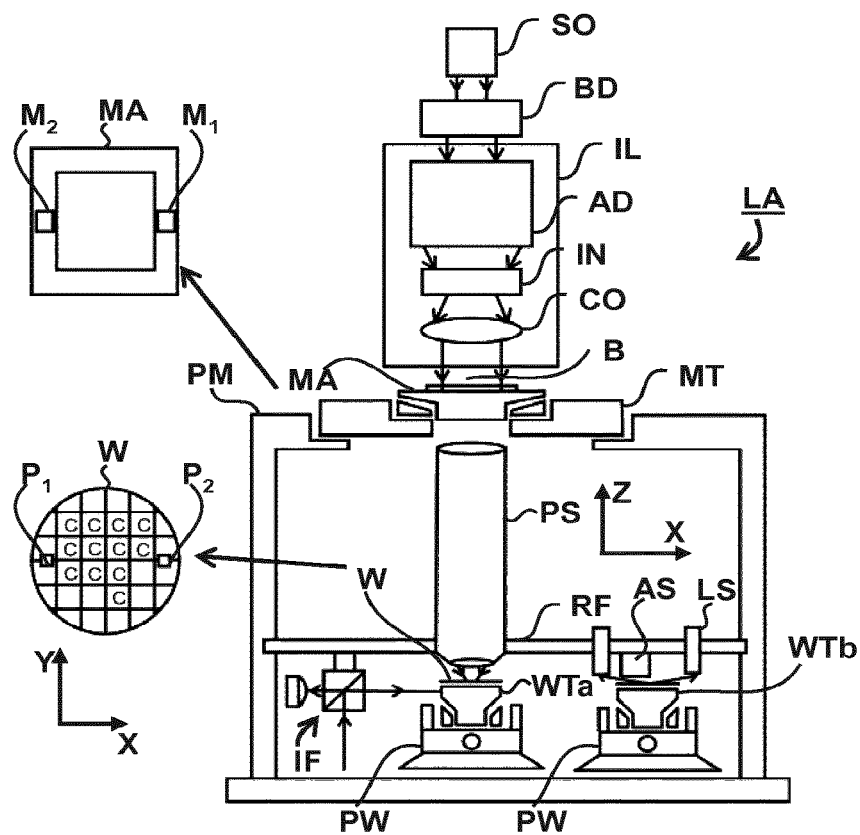
FIG. 1 schematically depicts a lithography apparatus, according to an embodiment.

The description herein relates generally to mask manufacturing and patterning processes. More particularly, the description relates to apparatuses or methods for determining an etch profile of a layer of a wafer for simulation systems. These simulation systems may use the determined etch profile during alignment metrology target design, as just one example, or in other operations. As described in more detail below, overlay is an indication of a relative shift between a current layer of a wafer and the previous layer. Overlay is often determined based on the optical response of metrology marks included in scribe lines. The metrology marks and the optical response are typically modeled using software tools such as ASML Design 4 Control (D4C) and YieldStar to facilitate optimization of the wafer manufacturing recipe and metrology mark design (e.g., to reduce overlay and/or for other purposes) before a wafer is physically manufactured.

A geometric model is used in current overlay and metrology mark design for patterning process definition (e.g., to model or otherwise determine etch profiles). For example, D4C or other similar tools need an etch profile (among many other process related inputs) to construct a "stack" that models an actual wafer to feed back into rigorous coupled-wave analysis (RCWA) for accurate simulation. However, the geometric model is overly simplistic (e.g., the model uses a constant etch depth, sidewall angle, a binary either etchable or non-etchable description of materials in the stack, etc.). Etch effects on the wafer such as the micro loading effect, bowing, etc., are not well described by the geometric model, which decreases simulation accuracy, and often results in poor correlation between simulated overlay measurements and actual overlay measurements. YieldStar (for example) or other scanner metrology mark signals are sensitive to modeled post-etch profiles, especially the depth of such profiles. Etch profile differences between modeled and actual profiles are often caused by the geometric model's inability to accurately account for local pattern features such as density and resist profile, and global effects such as chemical and physical non-uniformity.

For example, in some layers of a stack, the metrology marks are segmented to enhance process uniformity. However, YieldStar overlay marks may have a main pitch of around 500-800 nm, and other scanner alignment marks may require a pitch of around 1.6 um to generate a diffraction signal to determine the overlay or alignment position. The pattern density may vary significantly in the metrology mark area due to both process design and metrology constraints. The etch micro loading effect, for example, is often observed in the metrology mark area.

With the system(s) and method(s) described below, the local loading effect is modeled using visibility angles, pattern density, and other parameters. Thus, more accurate simulated etch profiles may be fed into the D4C software (or other similar tools), which may help more accurately simulate the response of the YieldStar signal or other scanner metrology mark signals, to achieve more accurate predictions of overlay or other parameters.

The semi-empirical model (in contrast to prior geometric models) of the present system(s) and method(s) uses multiple parameters to represent the plasma physics and material behavior, and reconstructs the post etch profile by capturing the local etch loading effect, which is caused by pattern size and density. In the present system(s) and method(s), the global loading effect is introduced by adding the electrical field distribution, and other perturbations to mimic chemical and physical non-uniformities. In addition, the model of the present system(s) and method(s) may be calibrated based on cross sectional secondary electron microscope (SEM) images to ensure modeled process steps described herein accurately reflect specific etch processes.

The following paragraphs describe several components of a system and/or related systems, as well as methods for determining an etch profile of a layer of a wafer for simulation systems. As described above these simulation systems may use the determined etch profile during alignment metrology target design, for example, or during other operations.

Although specific reference may be made in this text to the manufacture of integrated circuits (ICs), it should be understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

FIG. 1 schematically depicts an embodiment of a lithographic apparatus LA. The apparatus comprises:

an illumination system (illuminator) IL configured to condition a radiation beam B (e.g. UV radiation, DUV radiation, or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT (e.g., WTa, WTb or both) configured to hold a substrate (e.g. a resist-coated wafer) W and coupled to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies and often referred to as fields) of the substrate W. The projection system is supported on a reference frame (RF).

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjuster AM configured to adjust the (angular/spatial) intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable to alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic or other types of optical components, or any combination thereof, for directing, shaping, or controlling radiation.

Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure may use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in a target portion of the device, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CODs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines, the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

In operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus may be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) or deep ultraviolet (DUV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

Various patterns on or provided by a patterning device may have different process windows. i.e., a space of processing variables under which a pattern will be produced within specification. Examples of pattern specifications that relate to potential systematic defects include checks for necking, line pull back, line thinning, CD, edge placement, overlapping, resist top loss, resist undercut and/or bridging. The process window of the patterns on a patterning device or an area thereof may be obtained by merging (e.g., overlapping) process windows of each individual pattern. The boundary of the process window of a group of patterns comprises boundaries of process windows of some of the individual patterns. In other words, these individual patterns limit the process window of the group of patterns. These patterns can be referred to as "hot spots" or "process window limiting patterns (PWLPs)," which are used interchangeably herein. When controlling a part of a patterning process, it is possible and economical to focus on the hot spots. When the hot spots are not defective, it is most likely that other patterns are not defective.

Figure 2:
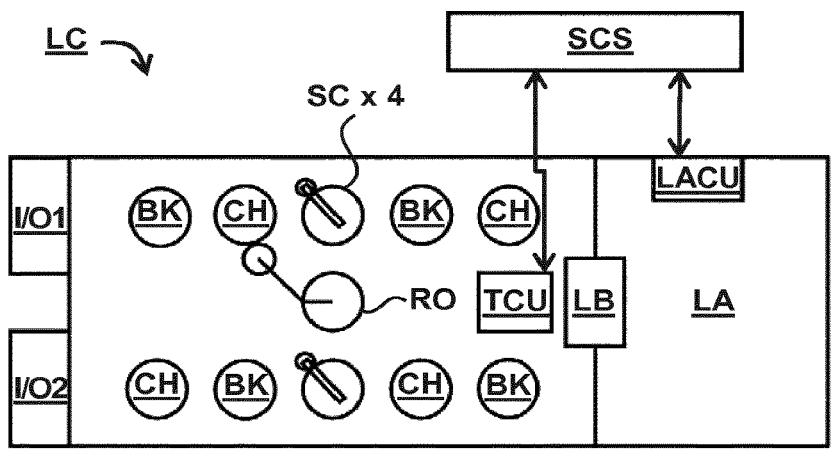
FIG. 2 schematically depicts an embodiment of a lithographic cell or cluster, according to an embodiment.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently and/or in order to monitor a part of the patterning process (e.g., a device manufacturing process) that includes at least one pattern transfer step (e.g., an optical lithography step), it is desirable to inspect a substrate or other object to measure or determine one or more properties such as alignment, overlay (which can be, for example, between structures in overlying layers or between structures in a same layer that have been provided separately to the layer by, for example, a double patterning process), line thickness, critical dimension (CD), focus offset, a material property, etc. Accordingly, a manufacturing facility in which lithocell LC is located also typically includes a metrology system MET that measures some or all of the substrates W that have been processed in the lithocell or other objects in the lithocell. The metrology system MET may be part of the lithocell LC, for example it may be part of the lithographic apparatus LA (such as alignment sensor AS).

The one or more measured parameters may include, for example, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on the substrate. The measurement can be performed after-development of a resist but before etching, or may be performed after-etch.

There are various techniques for making measurements of the structures formed in the patterning process, including the use of a scanning electron microscope, an image-based measurement tool and/or various specialized tools. As discussed above, a fast and non-invasive form of specialized metrology tool is one in which a beam of radiation is directed onto a target on the surface of the substrate and properties of the scattered (diffracted/reflected) beam are measured. By evaluating one or more properties of the radiation scattered by the substrate, one or more properties of the substrate can be determined. This may be termed diffraction-based metrology. One such application of this diffraction-based metrology is in the measurement of feature asymmetry within a target. This can be used as a measure of overlay, for example, but other applications are also known. For example, asymmetry can be measured by comparing opposite parts of the diffraction spectrum (for example, comparing the −1st and +1st orders in the diffraction spectrum of a periodic grating). This can be done as described above and as described, for example, in U.S. patent application publication US 2006-066855, which is incorporated herein in its entirety by reference. Another application of diffraction-based metrology is in the measurement of feature width (CD) within a target. Such techniques can use the apparatus and methods described hereafter.

Thus, in a device fabrication process (e.g., a patterning process or a lithography process), a substrate or other objects may be subjected to various types of measurement during or after the process. The measurement may determine whether a particular substrate is defective, may establish adjustments to the process and apparatuses used in the process (e.g., aligning two layers on the substrate or aligning the patterning device to the substrate), may measure the performance of the process and the apparatuses, or may be for other purposes. Examples of measurement include optical imaging (e.g., optical microscope), non-imaging optical measurement (e.g., measurement based on diffraction such as the ASML YieldStar metrology tool, the ASML SMASH metrology system), mechanical measurement (e.g., profiling using a stylus, atomic force microscopy (AFM)), and/or non-optical imaging (e.g., scanning electron microscopy (SEM)). The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which meet specifications.

Within a metrology system MET, a metrology apparatus is used to determine one or more properties of the substrate, and in particular, how one or more properties of different substrates vary or different layers of the same substrate vary from layer to layer. As noted above, the metrology apparatus may be integrated into the lithographic apparatus LA or the lithocell LC or may be a stand-alone device.

To enable the metrology, one or more targets can be provided on the substrate. In an embodiment, the target is specially designed and may comprise a periodic structure. In an embodiment, the target is a part of a device pattern, e.g., a periodic structure of the device pattern. In an embodiment, the device pattern is a periodic structure of a memory device (e.g., a Bipolar Transistor (BPT), a Bit Line Contact (BLC), etc. structure).

In an embodiment, the target on a substrate may comprise one or more 1-D periodic structures (e.g., gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars, or vias may alternatively be etched into the substrate (e.g., into one or more layers on the substrate).

In an embodiment, one of the parameters of interest of a patterning process is overlay. Overlay can be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by device product structures on a substrate. In an embodiment, multiple targets can be measured in one radiation capture.

Figure 3:
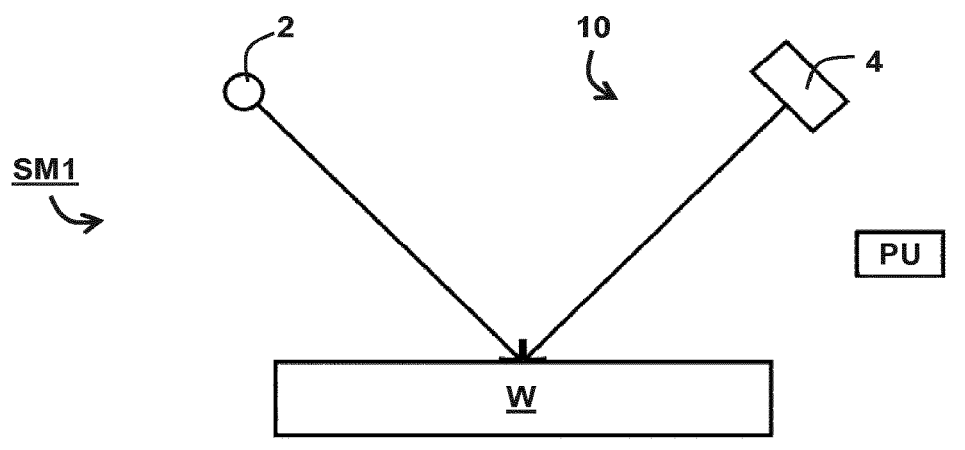
FIG. 3 schematically depicts an example inspection apparatus and metrology technique, according to an embodiment.
Figure 3:
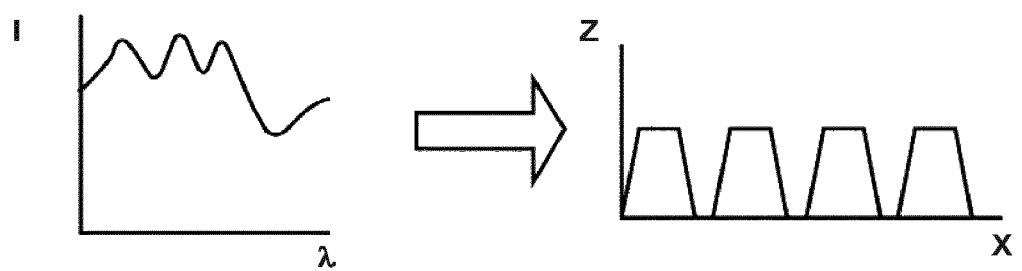

FIG. 3 depicts an example inspection apparatus (e.g., a scatterometer). It comprises a broadband (white light) radiation projector 2 which projects radiation onto a substrate W. The redirected radiation is passed to a spectrometer detector 4, which measures a spectrum 10 (intensity as a function of wavelength) of the specular reflected radiation, as shown, e.g., in the graph in the lower left of FIG. 3. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 3. In general, for the reconstruction the general form of the structure is known and some variables are assumed from knowledge of the process by which the structure was made, leaving only a few variables of the structure to be determined from the measured data. Such an inspection apparatus may be configured as a normal-incidence inspection apparatus or an oblique-incidence inspection apparatus.

Figure 4:
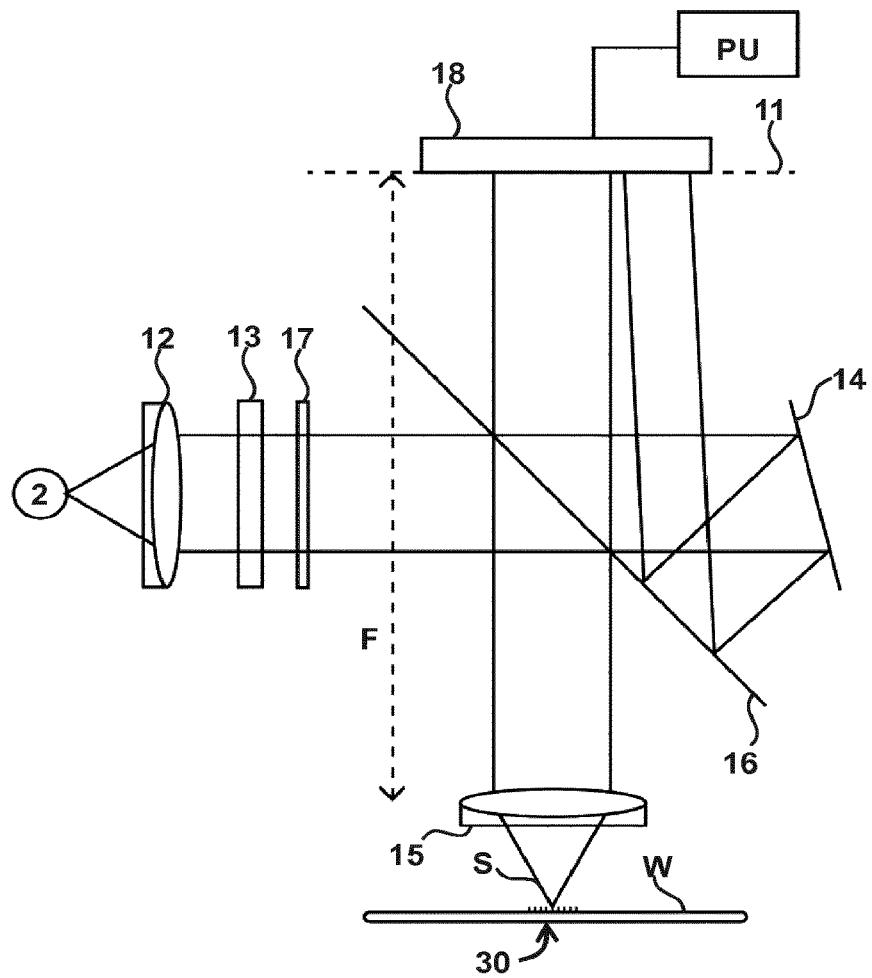
FIG. 4 schematically depicts an example inspection apparatus, according to an embodiment.

Another inspection apparatus that may be used is shown in FIG. 4. In this device, the radiation emitted by radiation source 2 is collimated using lens system 12 and transmitted through interference filter 13 and polarizer 17, reflected by partially reflecting surface 16 and is focused into a spot S on substrate W via an objective lens 15, which has a high numerical aperture (NA), desirably at least 0.9 or at least 0.95. An immersion inspection apparatus (using a relatively high refractive index fluid such as water) may even have a numerical aperture over 1.

As in the lithographic apparatus LA, one or more substrate tables may be provided to hold the substrate W during measurement operations. The substrate tables may be similar or identical in form to the substrate table WT of FIG. 1. In an example where the inspection apparatus is integrated with the lithographic apparatus, they may even be the same substrate table. Coarse and fine positioners may be provided to a second positioner PW configured to accurately position the substrate in relation to a measurement optical system. Various sensors and actuators are provided for example to acquire the position of a target of interest, and to bring it into position under the objective lens 15. Typically many measurements will be made on targets at different locations across the substrate W. The substrate support can be moved in X and Y directions to acquire different targets, and in the Z direction to obtain a desired location of the target relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and only the substrate moves. Provided the relative position of the substrate and the optical system is correct, it does not matter in principle which one of those is moving in the real world, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

The radiation redirected by the substrate W then passes through partially reflecting surface 16 into a detector 18 in order to have the spectrum detected. The detector 18 may be located at a back-projected focal plane 11 (i.e., at the focal length of the lens system 15) or the plane 11 may be re-imaged with auxiliary optics (not shown) onto the detector 18. The detector may be a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam may be used, for example, to measure the intensity of the incident radiation. To do this, when the radiation beam is incident on the partially reflecting surface 16 part of it is transmitted through the partially reflecting surface 16 as a reference beam towards a reference mirror 14. The reference beam is then projected onto a different part of the same detector 18 or alternatively on to a different detector (not shown).

One or more interference filters 13 are available to select a wavelength of interest in the range of, say, 405-790 nm or even lower, such as 200-300 nm. The interference filter may be tunable rather than comprising a set of different filters. A grating could be used instead of an interference filter. An aperture stop or spatial light modulator (not shown) may be provided in the illumination path to control the range of angle of incidence of radiation on the target.

The detector 18 may measure the intensity of redirected radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may be etched into or on the substrate (e.g., into one or more layers on the substrate). The pattern (e.g., of bars, pillars or vias) is sensitive to change in processing in the patterning process (e.g., optical aberration in the lithographic projection apparatus (particularly the projection system PS), focus change, dose change, etc.) and will manifest in a variation in the printed grating. Accordingly, the measured data of the printed grating is used to reconstruct the grating. One or more parameters of the 1-D grating, such as line width and/or shape, or one or more parameters of the 2-D grating, such as pillar or via width or length or shape, may be input to the reconstruction process, performed by processor PU, from knowledge of the printing step and/or other inspection processes.

In addition to measurement of a parameter by reconstruction, angle resolved scatterometry is useful in the measurement of asymmetry of features in product and/or resist patterns. A particular application of asymmetry measurement is for the measurement of overlay, where the target 30 comprises one set of periodic features superimposed on another. The concepts of asymmetry measurement using the instrument of FIG. 3 or FIG. 4 are described, for example, in U.S. patent application publication US2006-066855, which is incorporated herein in its entirety. Simply stated, while the positions of the diffraction orders in the diffraction spectrum of the target are determined only by the periodicity of the target, asymmetry in the diffraction spectrum is indicative of asymmetry in the individual features which make up the target. In the instrument of FIG. 4, where detector 18 may be an image sensor, such asymmetry in the diffraction orders appears directly as asymmetry in the pupil image recorded by detector 18. This asymmetry can be measured by digital image processing in unit PU, and calibrated against known values of overlay.

Figure 5:
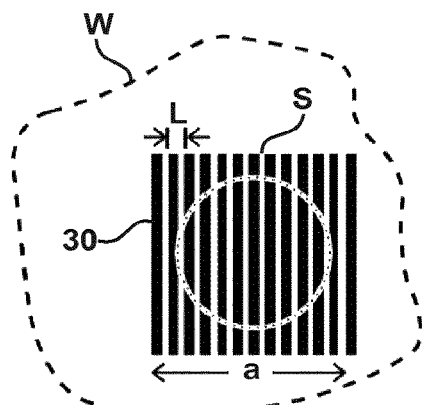
FIG. 5 illustrates the relationship between an illumination spot of an inspection apparatus and a metrology target, according to an embodiment.

FIG. 5 illustrates a plan view of a typical target 30, and the extent of illumination spot S in the apparatus of FIG. 4. To obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. The illumination arrangement 2, 12, 13, 17 (FIG. 4) may be configured to provide illumination of a uniform intensity across a back focal plane of objective 15. Alternatively, by, e.g., including an aperture in the illumination path, illumination may be restricted to on axis or off axis directions.

Figure 6:
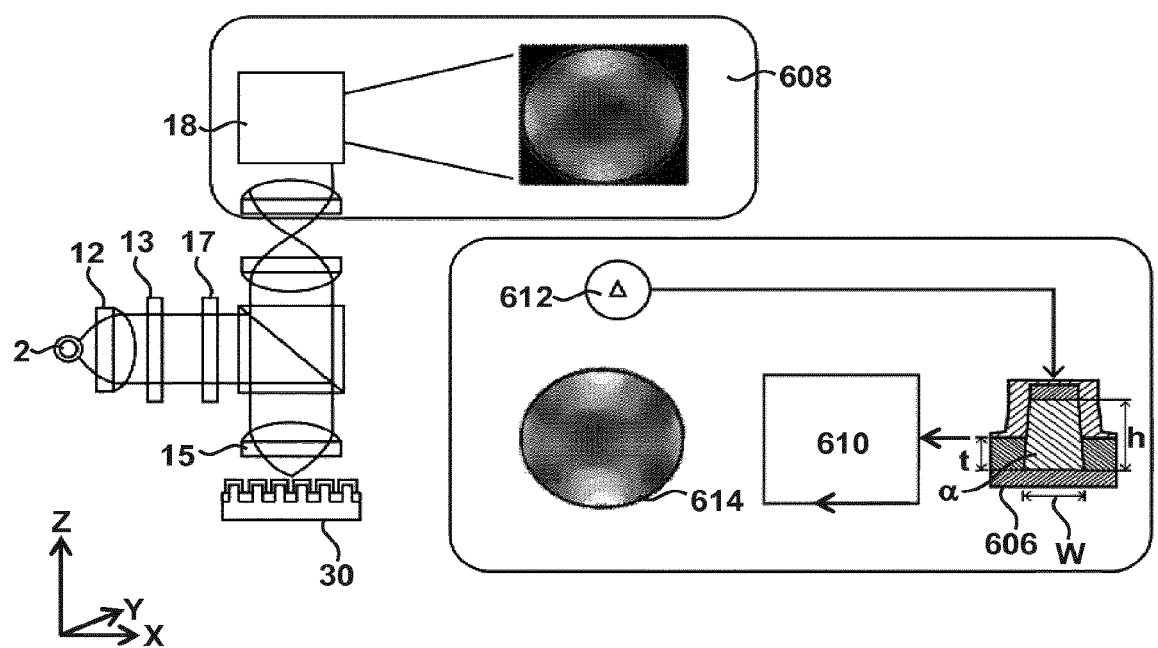
FIG. 6 schematically depicts a process of deriving a plurality of variables of interest based on measurement data, according to an embodiment.

FIG. 6 schematically depicts an example process of the determination of the value of one or more variables of interest of a target pattern 30 based on measurement data obtained using metrology. Radiation detected by the detector 18 provides a measured radiation distribution 608 for target 30. For a given target 30, a radiation distribution 612 can be computed/simulated from a parameterized model 606 using, for example, a numerical Maxwell solver 610. The parameterized model 606 shows example layers of various materials making up, and associated with, the target. The parameterized model 606 may include one or more of variables for the features and layers of the portion of the target under consideration, which may be varied and derived. As shown in FIG. 6, the one or more of the variables may include the thickness t of one or more layers, a width w (e.g., CD) of one or more features, a height h of one or more features, and/or a sidewall angle α of one or more features. Although not shown, the one or more of the variables may further include, but is not limited to, the refractive index (e.g., a real or complex refractive index, refractive index tensor, etc.) of one or more of the layers, the extinction coefficient of one or more layers, the absorption of one or more layers, resist loss during development, a footing of one or more features, and/or line edge roughness of one or more features. The initial values of the variables may be those expected for the target being measured. The measured radiation distribution 608 is then compared at 612 to the computed radiation distribution 612 to determine the difference between the two. If there is a difference, the values of one or more of the variables of the parameterized model 606 may be varied, a new computed radiation distribution 612 calculated and compared against the measured radiation distribution 608 until there is sufficient match between the measured radiation distribution 608 and the computed radiation distribution 612. At that point, the values of the variables of the parameterized model 606 provide a good or best match of the geometry of the actual target 30. In an embodiment, there is sufficient match when a difference between the measured radiation distribution 608 and the computed radiation distribution 612 is within a tolerance threshold.

Figure 7A:
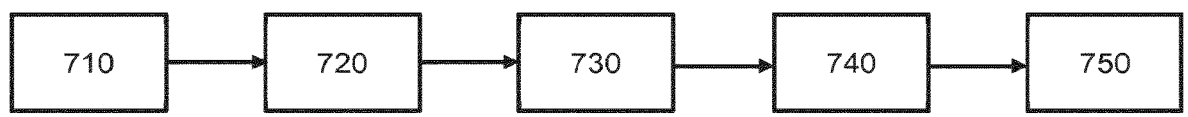
FIG. 7A is a flow chart showing various stages of a 'design for control' process flow, according to an embodiment.

FIG. 7A shows a flowchart that lists the main stages of a "design for control" (D4C) method. In stage 710, the materials to be used in the lithography process are selected. The materials may be selected from a materials library interfaced with D4C through an appropriate GUI. In stage 720, a lithography process is defined by entering each of the process steps, and building a computer simulation model for the entire process sequence. In stage 730, a metrology target is defined, i.e. dimensions and other characteristics of various features included in the target are entered into the D4C program. For example, if a grating is included in a structure, then number of grating elements, width of individual grating elements, spacing between two grating elements etc. have to be defined. In stage 740, the 3D geometry is created. This step also takes into account whether there is any information relevant to a multi-layer target design, for example, the relative shifts between different layers. This feature enables multi-layer target design. In stage 750, the final geometry of the designed target is visualized. As will be explained in greater detail below, not only the final design is visualized, but as the designer applies various steps of the lithography process, he/she can visualize how the 3D geometry is being formed and changed because of process-induced effects. For example, the 3D geometry after resist patterning is different from the 3D geometry after resist removal and etching.

Figure 7B:
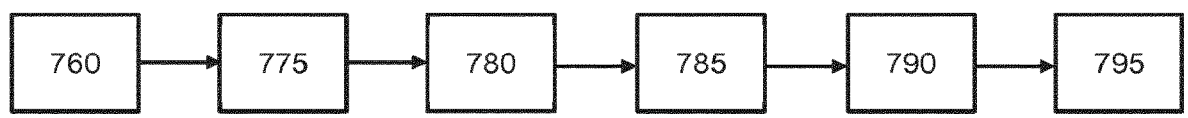
FIG. 7B is a block diagram showing various stages for visualization, according to an embodiment.

An important aspect of the present disclosure is that the target designer is enabled to visualize the stages of the method to facilitate their perception and control during modeling and simulation. Different visualization tools, referred to as "viewers," are built into the D4C software. For example, as shown in FIG. 7B, a designer can view material plots 760 (and may also get a run time estimation plot) depending on the defined lithography process and target. Once the lithography model is created, the designer can view the model parameters through model viewer tool 775. Design layout viewer tool 780 may be used to view the design layout (e.g., visual rendering of the GDS file). Resist profile viewer tool 785 may be used to view pattern profiles in a resist. Geometry viewer tool 790 may be used to view 3D structures on a substrate. A pupil viewer tool 795 may be used to view simulated response on a metrology tool. Persons skilled in the art would understand that these viewing tools are available to enhance the understanding of the designer during design and simulation. One or more of these tools may not be present in some embodiments of D4C software, and additional viewing tools may be there in some other embodiments.

Figure 7C:
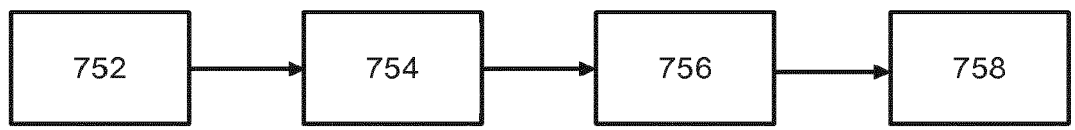
FIG. 7C is a flow chart showing how the 'design for control' process determines metrology target designs robust against process perturbations, according to an embodiment.

FIG. 7C shows a flow chart that illustrates how the D4C process increases efficiency in the overall simulation process by reducing the number of metrology targets selected for the actual simulation of the lithography process. As mentioned before, D4C enables designers to design thousands or even millions of designs. Not all of these designs may be robust against variations in the process steps. To select a subset of target designs that can withstand process variation, a lithographer may intentionally perturb one or more steps of the defined lithography process, as shown in block 752. The introduction of the perturbation alters the entire process sequence with respect to how it was originally defined. Therefore, applying the perturbed process sequence (block 754) alters the 3D geometry of the designed target too. A lithographer only selects the perturbations that show non-zero alternations in the original design targets and creates a subset of selected process perturbations (block 756). The lithography process is then simulated with this subset of process perturbations (block 758).

The manufacturing or fabrication of a substrate using the lithographic process (or patterning process in general) typically involves process variations. The process variations are not uniform across the substrate. For example, in deposition processes, films tend to be thicker at the center of the substrate and be thinner when close to edge. These systematic variations are usually reflected in measurements data as 'fingerprints', which are characteristics of a substrate based on known process conditions. In other words, there exists a stack on a substrate that has a spatial variation as a function of substrate coordinate. A stack comprises multiple layers formed on a substrate during the patterning process to form a selected pattern (e.g., a design pattern) on the substrate. Each layer of the stack can be associated with a thickness, material properties, and features and related parameters of the patterning process (e.g. CD, pitch, overlay, etc.).

Figure 8A:
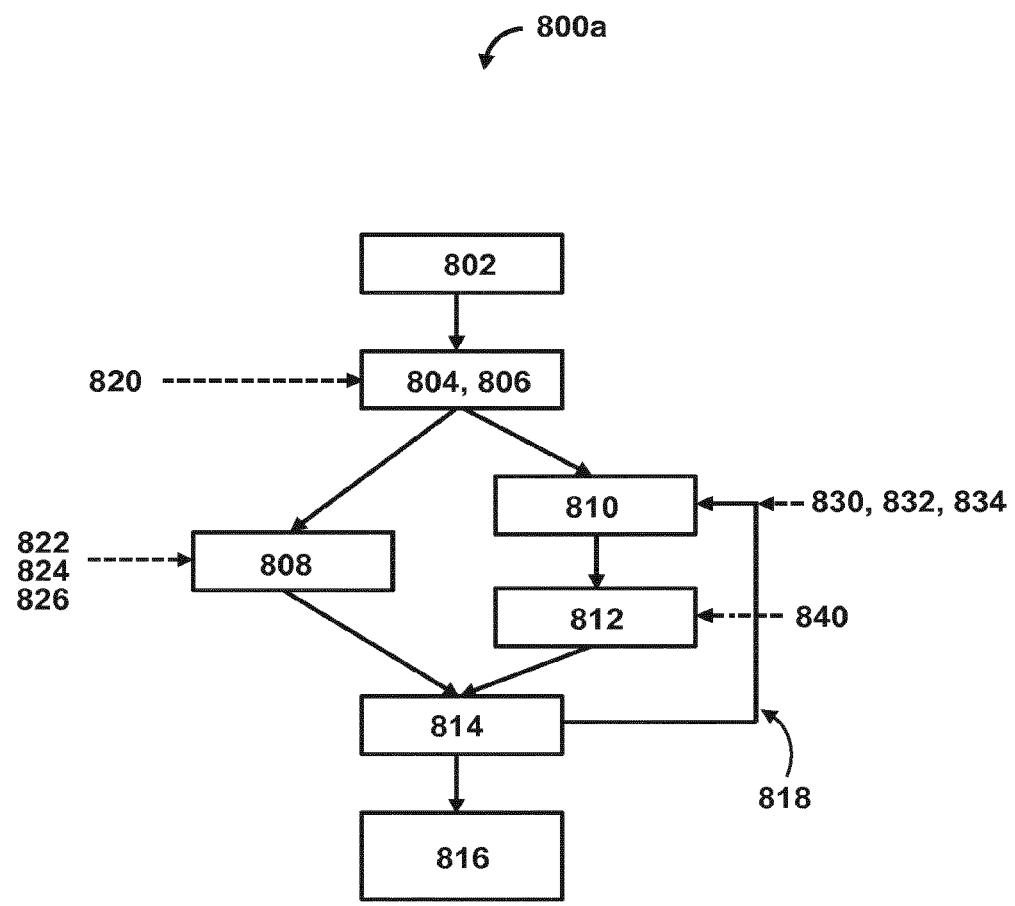
FIG. 8a illustrates a method for determining an etch profile of a layer of a wafer for a simulation system, according to an embodiment.
Figure 8B:
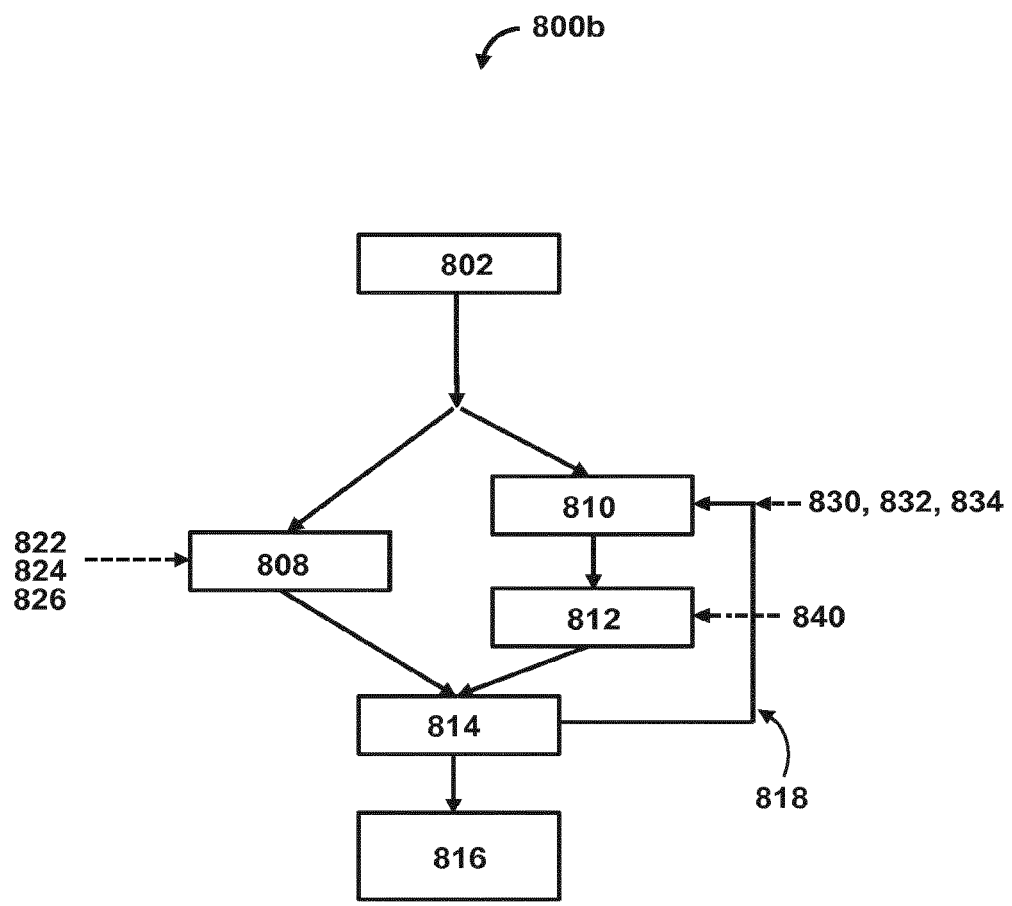
FIG. 8b illustrates a similar method for determining an etch profile of a layer of a wafer for a simulation system, but without trim-related operations, according to an embodiment.

FIG. 8*a* illustrates a method 800*a* for determining an etch profile of a layer of a wafer for a simulation system, or for other purposes, according to an embodiment of the present disclosure. FIG. 8*b* illustrates a similar method for determining an etch profile of a layer of a wafer for a simulation system, but without trim-related operations. Method 800*a* and 800*b* are described below in the context of metrology mark alignment, but this is not intended to be limiting. In some embodiments, the etch profile generated from process 800*a* or 800*b* can be used as input to a downstream design-for-control application, for example to determine optimal overlay marks and/or alignment marks. Method 800*a* and 800*b* may be generally applied to a number of different processes where etch profile determination is useful. A simulation system for which an etch profile is determined may be configured to simulate a response of metrology or inspection systems to the etch profile, or other simulation functions. For example, a determined etch profile/simulation system can be used for calibrating an OPC model measured with optical systems or SEM, it can be used to simulate cross wafer fingerprints from metrology systems, or for other purposes. According to embodiment of the present disclosure, method 800*a* and 800*b* are enhanced (relative to prior art systems) etch profile determination methods that advantageously facilitate more accurate and realistic modeling and/or determination of an etch profile. This more accurate modeling and/or determination of an etch profile may advantageously enhance determination of the relative shift between a current layer of a wafer and the previous layer—overlay, for example, though other purposes are contemplated. As described above, overlay is often determined based on the optical response of metrology marks included in scribe lines. In some embodiments, method 800*a* and 800*b* generate a more accurate (relative to prior art systems) metrology target model, which in turn, facilitates more accurate (relative to prior art systems) determination of overlay or other parameters in a design-for-control process. According to embodiments of the present disclosure, in method 800*a* and 800*b*, the local loading effect is modeled using visibility angles, pattern density, and other parameters. This semi-empirical model (in contrast to prior geometric models) uses multiple parameters to represent the plasma physics and material behavior, and reconstructs the post etch profile by capturing the local etch loading effect, which is caused by pattern size and density, among other factors. The global loading effect is introduced by adding the electrical field distribution, and other perturbations to mimic chemical and physical non-uniformities. In addition, the model of the present apparatuses and methods may be calibrated by cross section secondary electron microscope (SEM) images to accurately describe specific etch processes.

Method 800*a* and 800*b* comprise determining 802 a starting masking layer profile for the layer of the wafer. Method 800*a* includes determining 804 a resist trim etching recipe and determining 806 a trimmed masking layer profile (these operations are not included in method 800*b*). Method 800*a* and 800*b* comprise determining 808 loading information, determining 810 flux information, determining re-deposition information 812, determining 814 an output etch profile for the layer of the wafer, and determining 816 depth information based on the output etch profile for use by simulation systems (e.g., during metrology target design and/or other operations). Determining 814 the output etch profile for the layer of the wafer is based on the loading information, the flux information, the re-deposition information, and/or other information as described herein. In an embodiment, determining 802 the starting masking layer profile, determining or otherwise simulating 804, 806 the trim operation, determining 808 the loading information, determining 810 the flux information, determining 812 the re-deposition information, and/or determining 814 the output etch profile are performed for a region of interest of the layer of the wafer. In an embodiment, determining the loading information, determining the flux information, determining the re-deposition information, and/or determining the output etch profile are performed iteratively 818 until the depth information corresponds to depths in an image of a corresponding layer of a physical wafer. Each of these operations are discussed in turn below.

It should be noted that the order, arrangement, input, and output of operations 802-818 shown in FIG. 8*a* and/or 8*b* and discussed below is not intended to be limiting. For example, FIG. 8*a* illustrates determining 802 a starting masking layer profile, which is used as input for determining 804 a resist trim etching recipe and determining 806 a trimmed masking layer profile. However, FIG. 8*b* does not include these operations at all. As another example, in FIG. 8*a*, determining 804 the resist trim etching recipe may include receiving the resist trim etching recipe or information related to a resist trim etching recipe from external resources that are not part of the present system via user input or selection of recipe parameters through a user interface, or through other operations. In this example, the starting masking layer profile may be modified using the received resist trim etching recipe to produce the trimmed masking layer profile. As another example, FIG. 8*a* illustrates the trimmed masking layer profile (and FIG. 8*b* illustrates the starting masking layer profile) being used as input for the loading information determination 808 and the flux information determination 810, but not the re-deposition information determination 812. In an embodiment, these three operations may be performed in parallel (or in other arrangements) and (in FIG. 8*a*) the trimmed masking layer profile (and if FIG. 8*b*, the starting masking layer profile) may be used as input for all three determinations. In this example, the output from all three of these operations may flow directly into the profile determination 814 step. Numerous other examples of various orders, arrangements, inputs, and outputs for the determinations illustrated in FIGS. 8*a* and 8*b* are contemplated.

As shown in FIGS. 8*a* and 8*b*, method 800*a* and 800*b* comprise determining 802 a starting masking layer profile for the layer of the wafer. The starting masking layer profile may be and/or include a resist profile such as a lithography photo resist profile, a generic masking layer such as a hardmask, or other masking layer profiles. In general, the starting masking layer profile may be any pattern design used as input for method 800*a* and 800*b*. The pattern design may indicate which parts of a wafer will be etched and which parts of a wafer will not be etched. The pattern design may indicate dimensions, material properties, and other characteristics of these etch and non-etch areas.

In some embodiments, the starting masking layer profile, e.g., a resist profile, can be derived directly from the geometry and dimensions of the corresponding pattern target design without involving the lithography or patterning process simulation.

In an embodiment, the starting masking layer profile for the layer of the wafer comprises an after patterning profile. In an embodiment, the starting masking layer profile for the layer of the wafer comprises after develop inspection (ADI) dimensions. ADI is often performed after photoresist exposure and development. Compared to a corresponding target design, an ADI profile advantageously contains additional information resulting from patterning process impact, such as corner rounding and/or stochastic roughness. Therefore, using ADI as input in the simulation flow can lead to more accurate and realistic prediction.

In an embodiment, determining the starting masking layer profile for the layer of the wafer comprises one or more of obtaining, designing, or measuring dimensions or other features of the starting masking layer profile. For example, obtaining dimensions or other features of a starting masking layer profile may include electronically accessing this information via databases of one or more external computing systems, accessing this information in local electronic storage, receiving or accessing this information via network communications, receiving this information via upload, download, or other electronic file transfer from non-transitory storage media and/or other electronic storage sources, or obtaining this information by other methods. As another example, designed dimensions and/or other features of a starting masking layer profile may be entered or selected by, or otherwise communicated from, a user via a user interface associated with design software (e.g., D4C) or other resources. As a third example, dimensions or other features of a starting masking layer profile may be measured as part of method 800*a* and 800*b*. Such measurements may be taken, for example, on an immediately previous layer of a physical or modeled wafer going through a fabrication process. In some embodiments, the starting masking layer profile may also be built based on assumptions made by a designer, the system, or other sources.

In some other embodiments, the starting masking layer profile can be after-development inspection (ADI) profile resulting from modeling a patterning process.

In one example, a source model represents optical characteristics (including radiation intensity distribution, bandwidth and/or phase distribution) of the illumination of a patterning device. The source model can represent the optical characteristics of the illumination that include, but not limited to, numerical aperture settings, illumination sigma ($\sigma$) settings as well as any particular illumination shape (e.g. off-axis radiation shape such as annular, quadrupole, dipole, etc.), where sigma is outer radial extent of the illuminator.

A projection optics model represents optical characteristics (including changes to the radiation intensity distribution and/or the phase distribution caused by the projection optics) of the projection optics. The projection optics model can represent the optical characteristics of the projection optics, including aberration, distortion, one or more refractive indexes, one or more physical sizes, one or more physical dimensions, etc.

The patterning device/design layout model module captures how the design features are laid out in the pattern of the patterning device and may include a representation of detailed physical properties of the patterning device, as described, for example, in U.S. Pat. No. 7,587,704, which is incorporated by reference in its entirety. In an embodiment, the patterning device/design layout model module represents optical characteristics (including changes to the radiation intensity distribution and/or the phase distribution caused by a given design layout) of a design layout (e.g., a device design layout corresponding to a feature of an integrated circuit, a memory, an electronic device, etc.), which is the representation of an arrangement of features on or formed by the patterning device. Since the patterning device used in the lithographic projection apparatus can be changed, it is desirable to separate the optical properties of the patterning device from the optical properties of the rest of the lithographic projection apparatus including at least the illumination and the projection optics. The objective of the simulation is often to accurately predict, for example, edge placements and CDs, which can then be compared against the device design. The device design is generally defined as the pre-OPC patterning device layout, and will be provided in a standardized digital file format such as GDSII or OASIS.

An aerial image can be simulated from the source model, the projection optics model and the patterning device/design layout model. An aerial image (AI) is the radiation intensity distribution at substrate level. Optical properties of the lithographic projection apparatus (e.g., properties of the illumination, the patterning device and the projection optics) dictate the aerial image.

A resist layer on a substrate is exposed by the aerial image and the aerial image is transferred to the resist layer as a latent "resist image" (RI) therein. The resist image (RI) can be defined as a spatial distribution of solubility of the resist in the resist layer. A resist image can be simulated from the aerial image using a resist model. The resist model can be used to calculate the resist image from the aerial image, an example of which can be found in U.S. Patent Application Publication No. US 2009-0157360, the disclosure of which is hereby incorporated by reference in its entirety. The resist model typically describes the effects of chemical processes which occur during resist exposure, post exposure bake (PEB) and development, in order to predict, for example, contours of resist features formed on the substrate and so it typically related only to such properties of the resist layer (e.g., effects of chemical processes which occur during exposure, post-exposure bake and development). In an embodiment, the optical properties of the resist layer, e.g., refractive index, film thickness, propagation and polarization effects—may be captured as part of the projection optics model.

So, in general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of incident energy, which is further modified by diffusion processes and various loading effects. Efficient simulation methods that are fast enough for full-chip applications approximate the realistic 3-dimensional intensity distribution in the resist stack by a 2-dimensional aerial (and resist) image.

In an embodiment, the resist image can be used an input to a post-pattern transfer process model module. The post-pattern transfer process model defines performance of one or more post-resist development processes (e.g., etch, development, etc.).

Simulation of the patterning process can, for example, predict contours, CDs, edge placement (e.g., edge placement error), etc. in the resist and/or etched image. Thus, the objective of the simulation is to accurately predict, for example, edge placement, and/or aerial image intensity slope, and/or CD, etc. of the printed pattern.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process.

In some embodiments, resist images generated according to modeling of the above patterning can be used as the starting profile 802. In one embodiment, the patterning process simulation generates resist images of the features. A contour set of the features are extracted from the generated resist images. The contour set are then reconstructed into 3 dimensional profile and used as start masking layer profile. The model/method shown in FIGS. 8a and 8b may then include calibrating the starting masking layer profile to an accurate shape using data from cross-sectional profile images, and/or scatterometry measurements, for example.

In some embodiments, the trim process can simulate the etch process and thereby introduce microscale modification on the starting making layer profile (e.g., ADI resist image), such as CD offset, roughness tuning, or other stochastic effect. Method 800a comprises determining 804 a resist trim etching recipe. The resist trim etching recipe may specify various trim etching parameters or trim criteria. The trim etching parameters or trim criteria may include a trim time, target dimensions, etch gas(es), etch gas ratios, etch rate(s) (lateral and vertical), etch gas pressure, bias power, source power, temperature, and other parameters. In an embodiment, for example, determining a resist trim etching recipe may include electronically accessing recipe information via databases of one or more external computing systems, accessing this information in local electronic storage, receiving or accessing this information via network communications, receiving this information via upload, download, or other electronic file transfer from non-transitory storage media and/or other electronic storage sources, or obtaining this information by other methods. In an embodiment, trim etching parameters or trim criteria may be entered or selected by, or otherwise communicated from, a user via a user interface associated with design software (e.g., D4C) or other resources. In some embodiments, "trim" may be a general description of modification of the critical dimension (CD) different from the printed ADI dimension. In some embodiments, trim operations may involve another modeling loop from 804 to 814 for example.

Method 800a comprises determining 806 a trimmed masking layer profile by simulating a trim operation on the starting masking layer profile according to the resist trim etching recipe. In an embodiment, simulating the trim operation on the starting masking layer profile comprises modifying dimensions or other characteristics of the starting masking layer profile based on the dimensions and/or other characteristics of the starring masking layer profile, the trim etching parameters or trim criteria in the etch trim recipe, or other information. In an embodiment, simulating the trim operation on the starting masking layer profile comprises adjusting a mask critical dimension (CD) offset 820. In an embodiment, adjusting a mask critical dimension offset 820 comprises manually tuning the mask critical dimension offset 820 (e.g., by a user via a user interface and associated software tools), calibrating the mask critical dimension offset 820 based on images or measurements of a physical wafer, or other adjustment. In an embodiment, after a mask critical dimension offset 820 is adjusted, the process of simulating the trim operation on the starting masking layer profile according to the resist trim etching recipe may be repeated. This process may be repeated iteratively for example, until one or more trimmed masking layer profile criteria (e.g., dimensions, surface characteristics, etc.) are satisfied.

Method 800a and 800b comprise, based at least in part on the trimmed masking layer profile (800a) or the starting masking layer profile (800b), determining 808 loading information for the masking layer profile. The loading information indicates dependence of an etch rate for the masking layer profile on a quantity and pattern of material being etched, which parts of the pattern are covered or uncovered, the surrounding environment, or other factors. In an embodiment, determining the loading information for the masking layer profile comprises adjusting one or more of an etch rate constant 822, a short range loading factor 824, a long range loading factor 826, or other adjustable parameters. In an embodiment, adjusting etch rate constant 822, short range loading factor 824, long range loading factor 826, or other adjustable parameters comprises manually tuning etch rate constant 822, short range loading factor 824, a long range loading factor 826, etc. (e.g., by a user via a user interface and associated software tools), calibrating etch rate constant 822, short range loading factor 824, long range loading factor 826, etc. based on images or measurements of a physical wafer, or other adjustment. In an embodiment, after etch rate constant 822, short range loading factor 824, long range loading factor 826, etc. is adjusted, the process of determining 808 the loading information may be repeated.

In an embodiment, determining 808 the loading information comprises determining dependence of the etch rate at individual locations across the masking layer profile. These determinations may be made based on a quantity and pattern of material being etched at the individual location, which parts of the pattern are covered or uncovered, the surrounding environment, or other factors. In an embodiment, determining the dependence of the etch rate at the individual locations across the masking layer profile comprises determining individual loading factors for the individual locations.

Figure 9:
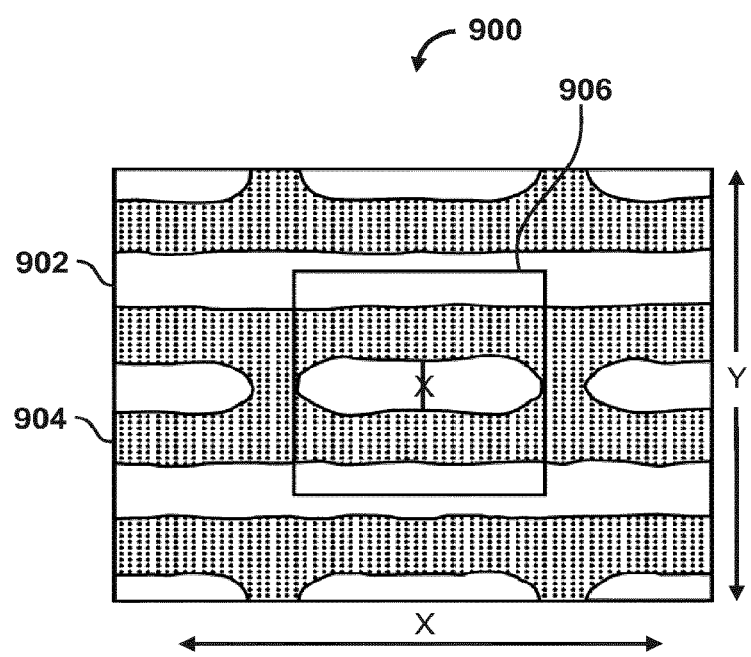
FIG. 9 illustrates aspects of determining loading information for a region of interest of a layer of a wafer, according to an embodiment.

By way of a non-limiting example, FIG. 9 illustrates aspects of determining loading information for a region of interest 900 of a masking layer profile. In some embodiments, the loading operation can be applied on a masking layer profile that may be a simulated or measured ADI, or a simulated or measured resist image, and the ADI or resist image may have been subject to the trim process. In some other embodiments, the loading operation can be applied on a masking layer profile that only contains the geometry and dimensional information derived from the target design and does not result from a patterning process or patterning process simulation. In an embodiment, FIG. 9 and the following discussion may describe a pattern density model of the present system(s) and method(s). The pattern density model may detect or otherwise model a surrounding mask pattern for individual sample points in a region of interest. As shown in FIG. 9, region of interest 900 includes trench regions 902 and mask regions 904 (this is not intended to be limiting). In an embodiment, determining 808 (FIGS. 8a and 8b) the loading information includes determining the dependence of an etch rate at individual X-Y locations across region 900. In an embodiment, determining the dependence of an etch rate at the individual X-Y locations includes determining individual loading factors at the individual locations. In an embodiment, an individual loading factor is determined based on a Boolean function of a mask pattern at an individual location, or other information. For example, an individual loading factor p for an individual X-Y location may be determined based on Equation 1.

$$p(x,y,r)=b(x,y,r)*M(x,y) \quad (1)$$

where x and y indicate coordinates of an evaluation point within region of interest 900, r is a range factor, M (x,y) indicates an overall mask pattern (e.g., a pattern of trench regions 902 and mask regions 904) or an ADI pattern (e.g., resist image pattern resulting from 802 and/or 804 as described above) within region of interest 900, and b(x,y,r) is a combination of a Boolean function and Gaussian distribution function of the mask pattern. In this example, p(x,y,r) is the individual X-Y location or area where the individual loading factor p is determined, and is represented by box 906 in FIG. 9. In this example, the Boolean function within b(x,y,r) is 0 in trench regions 902 and 1 in mask regions 904. After combining with the Gaussian function, it will be a value between 0 and 1.

Returning to FIGS. 8a and 8b, method 800a and 800b comprise, based at least in part on the trimmed masking layer profile (800a) or the starting masking layer profile (800b), determining 810 flux information for the masking layer profile. The flux information indicates dependence of the etch rate for the masking layer profile on an intensity and a spread angle of radiation incident on the masking layer profile, or other information. In an embodiment, determining the flux information for the masking layer profile comprises adjusting one or more of an ion intensity 830, a neutral intensity 832, a spread angle 834, or other characteristics of the incident radiation. In an embodiment, adjusting ion intensity 830, neutral intensity 832, spread angle 834, or other characteristics of the incident radiation comprises manually tuning ion intensity 830, neutral intensity 832, spread angle 834, or other characteristics of the incident radiation (e.g., by a user via a user interface and associated software tools), calibrating ion intensity 830, neutral intensity 832, spread angle 834, or other characteristics of the incident radiation based on images or measurements of a physical wafer, or other adjustment. In an embodiment, after ion intensity 830, neutral intensity 832, spread angle 834, or other characteristics of the incident radiation are adjusted, the process of determining 810 the flux information may be repeated.

In an embodiment, the flux information is determined based on one or more bias constants, one or more fitting constants, short range loading factors, and long range loading factors that correspond to individual locations. For example, neutral intensity 832 may be described by Equation 2 shown below.

$$f_{neutral}=c_o+(c_1*p_1)+(c_2*p_2) \quad (2)$$

In Equation 2, $c_o$ is a bias constant, $c_1$ and $c_2$ are short and long range fitting factors, and $p_1$ and $p_2$ are short and long range loading factors. Ion intensity 830 may be described by a similar equation, for example. The one or more bias constants, one or more fitting factors, short range loading factors, and long range loading factors may be determined at manufacture of the present system, obtained by the present system from electronic storage or other sources, entered, selected, or adjusted by a user via user interface associated with the system described herein, or determined in other ways.

In an embodiment, determining 810 the flux information comprises determining dependence of the etch rate at the individual locations across the masking layer profile on an intensity, a spread angle, or other characteristics of radiation incident on the masking layer profile at the individual locations. In an embodiment, this may be, or be part of, a visibility etch model of the present system(s) and method(s). For example, for individual etchable points in a region of interest (e.g., region 900 shown in FIG. 9), the visibility etch model may determine an etch rate (e.g., an etch rate vector) using a collection angle relative to a pre-defined incident (ion and neutral) radiation angle. In the present system(s) and method(s) etch rate is not assumed as in prior art systems. Determining 810 the flux information (e.g., the visibility etch model) may include modeling movement of etchable points in the region of interest toward incident radiation, determining etch rates based on the ion and neutral distributions over small time segments, repeating these operations at individual etchable points, and iterating according to Equation 3 shown below.

$$\overline{ER}=\int f(\vec{x})*(\int I_{ion}(\theta)*M(\theta)d\theta+\int I_{neutral}(\theta)*M(\theta)d\theta)dt \quad (3)$$

The f(x) term comes from Equation 2 above. Theta (θ) represents the incident angle.

Figure 10:
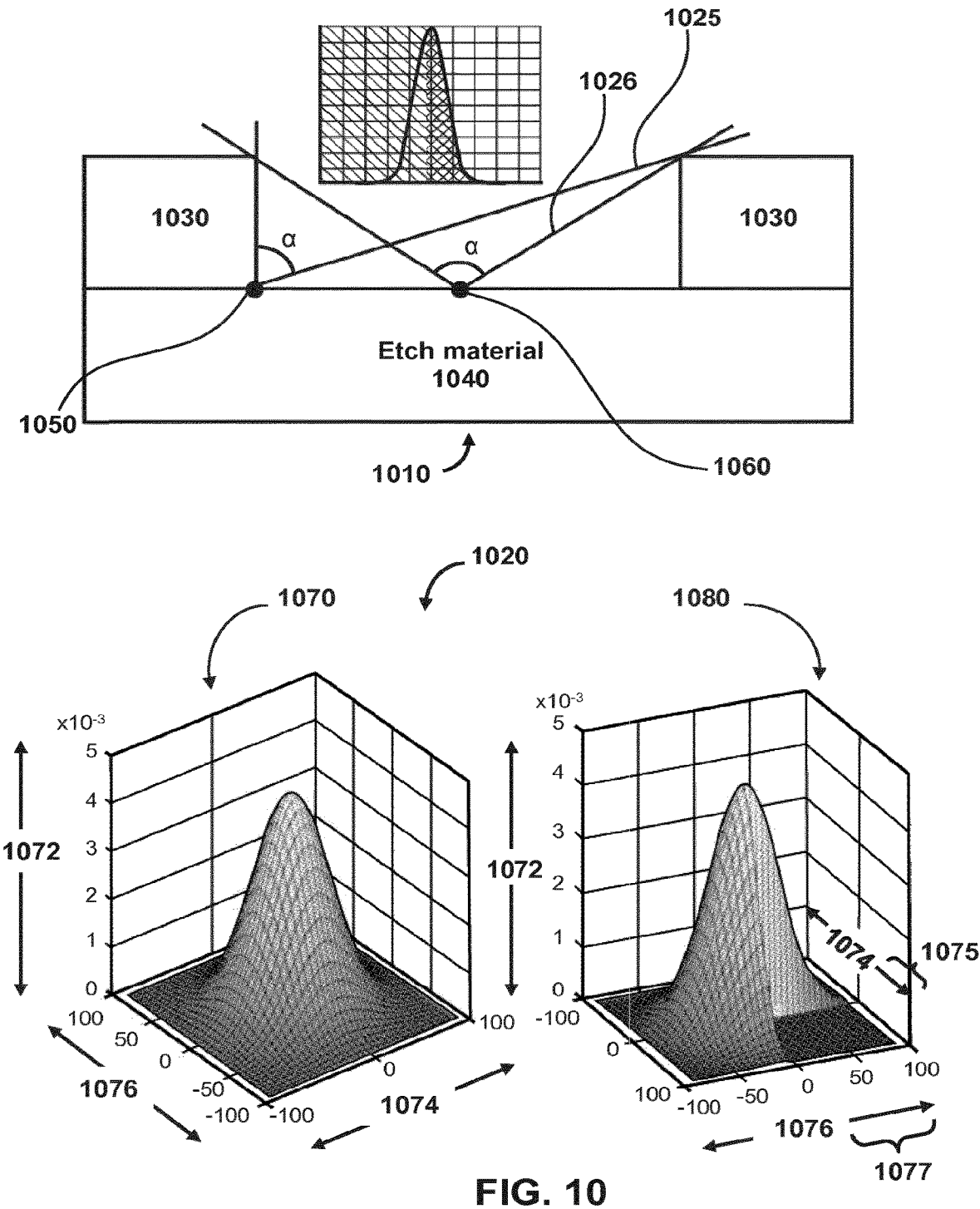
FIG. 10 provides two illustrations related to determining flux information, according to an embodiment.

By way of a non-limiting example, FIG. 10 provides two illustrations 1010 and 1020 related to determining (e.g., 810 from FIGS. 8a and 8b) flux information. Illustration 1010 shows radiation 1025, 1026 incident on mask material 1030 and etch material 1040. As etchable points 1050, 1060 in the region of interest are modeled moving relative to incident radiation 1025, 1026, the interaction of incident radiation 1025, 1026 with mask material 1030 and etch material 1040 changes. For example, in illustration 1010, angle alpha is different for incident radiation 1025 compared to incident radiation 1026. As another example, radiation 1025 is cut off or blocked by mask material 1030 while radiation 1026 is not. Illustration 1020 shows how, relative to prior art systems or methods, the present system(s) or method(s) better accounts for these interactions. For example, in "Before" image 1070, which corresponds to how prior art systems modeled radiation incident on mask and etch materials 1030 and 1040 shown in illustration 1010, flux intensity 1072 is unaffected in x direction 1074 or in y direction 1076, even though mask material 1030 may block or at least affect the incident radiation. In "After" image 1080, which corresponds to how the present system(s) and method(s) model radiation incident on mask and etch materials 1030 and 1040 shown in illustration 1010, flux intensity 1072 is truncated in x direction 1074 in a region 1075 and in y direction 1076 in a region 1077. The present system(s) and method(s) are configured such that this truncation is produced because the model is able to account for mask material 1030 blocking or at least affecting the incident radiation.

Returning to FIGS. 8*a* and 8*b*, method 800*a* and 800*b* comprise, based at least in part on the trimmed masking layer profile (FIG. 8*a*) or the starting masking layer profile (FIG. 8*b*), determining 812 re-deposition information for the masking layer profile. The re-deposition information indicates dependence of the etch rate for the masking layer profile on an amount of material removed from the masking layer profile that is re-deposited back on the masking layer profile. In an embodiment, determining the re-deposition information for the masking layer profile comprises adjusting a re-deposition rate 840 for the masking layer profile. In an embodiment, adjusting re-deposition rate 840 comprises manually tuning re-deposition rate 840 (e.g., by a user via a user interface and associated software tools), calibrating re-deposition rate 840 based on images or measurements of a physical wafer, or other adjustment. In an embodiment, after re-deposition rate 840 is adjusted, the process of determining 812 the re-deposition information may be repeated. In an embodiment, determining the re-deposition information comprises determining the dependence of the etch rate at the individual locations across the masking layer profile on an amount of material removed from the masking layer profile at the individual locations that is re-deposited back on the masking layer profile at the individual locations.

In an embodiment, the re-deposition information is determined based on one or more bias constants, long range fitting factors, and long range loading factors that correspond to individual locations. For example, re-deposition rate 840 may be described by Equation 4 shown below.

$$F_{redep} = c_3 + c_4 * p_3 \tag{4}$$

In Equation 4, $c_3$ and $c_4$ are constant and short range fitting factors, and $p_3$ is a short range loading factor. The one or more fitting factors and different range loading factors may be determined at manufacture of the present system, obtained by the present system from electronic storage or other sources, entered, selected, or adjusted by a user via user interface associated with the system described herein, or determined in other ways.

Method 800*a* and 800*b* comprise determining 814 an output etch profile for the layer of the wafer. The output etch profile for the layer of the wafer is determined based on the loading information, the flux information, the re-deposition information, or other information for the (trimmed or starting) masking layer profile. In an embodiment, determining 814 an output etch profile may be performed using methods similar to or the same as the methods described herein for determining an output etch profile using D4C, for example. However, as described above, the present system(s) and methods use the loading information, the flux information, and the re-deposition information to determine the output etch profile instead of using prior art simplified geometric models.

In an embodiment, method 800*a* and 800*b* comprises determining 816 depth information based on the output etch profile for use by simulation systems (e.g., during overlay determination in the metrology target design, and/or during other operations). In an embodiment, determining 816 the depth information may be determined using methods similar to or the same as the methods described herein for determining depth information using D4C, for example.

In an embodiment, one or more (parameters of) operations of method 800*a* and 800*b* may be calibrated by fitting a simulated depth profile to a corresponding cross section of a physical wafer using a scanning electron microscope (SEM) or other tools. In an SEM, a primary electron beam is emitted from an electron source and converged by a condenser lens, and then passes through a beam deflector, an E×B deflector, and an objective lens to irradiate a substrate on a substrate table at a focus. When the substrate is irradiated with the electron beam, secondary electrons are generated from the substrate. The secondary electrons are deflected by the E×B deflector and detected by a secondary electron detector. A two-dimensional electron beam image can be obtained by detecting the electrons generated from the sample in synchronization with, e.g., two dimensional scanning of the electron beam by the beam deflector or with repetitive scanning of the electron beam by the beam deflector in an X or Y direction, together with continuous movement of the substrate by the substrate table in the other of the X or Y direction. A signal detected by the secondary electron detector is converted to a digital signal by an analog/digital (A/D) converter, and the digital signal is sent to an image processing system. In an embodiment, the image processing system may have memory to store all or part of digital images for processing by a processing unit. The processing unit (e.g., specially designed hardware or a combination of hardware and software or a computer readable medium comprising software) is configured to convert or process the digital images into datasets representative of the digital images. In an embodiment, the processing unit is configured or programmed to cause execution of a method described herein. Further, the image processing system may have a storage medium configured to store the digital images and corresponding datasets in a reference database. A display device may be connected with the image processing system, so that an operator can conduct necessary operation of the equipment with the help of a graphical user interface.

In an embodiment, method 800*a* and 800*b* further comprise generating an electronic depiction (e.g., a model, an electronic image, etc.) of the layer of the wafer based on the depth information to facilitate a visual comparison between the electronic depiction and the image of the corresponding layer of the physical wafer. The electronic depiction may be an image (e.g., an SEM image) a model, and/or other electronic depictions. The electronic depiction may be a cross-sectional image, a non-cross-sectional image, numbers or code representative of a layer (e.g., not an image at all), or other information that forms an electronic depiction. In an embodiment, the methods further comprise generating an electronic depiction of the layer of the wafer based on the depth information to facilitate dimensional measurement of the electronic depiction for comparison to dimensions obtained from the image of the corresponding layer of the physical wafer. In an embodiment, one or more (parameters of) operations of method 800*a* and 800*b* may be calibrated based on information from any metrology system (e.g., a scatterometer, etc.). In an embodiment, the present system may include an independent calibration system comprising the etch model (e.g., methods 800*a* and/or 800*b*) and a metrology system. In an embodiment, mask layers may be measured or simulated (e.g., a lithography simulator may generate a profile output). Calibration may include calibration of parameters in a mask layer model (e.g., parameters that influence the resist profile of the lithography model).

As described above, one or more operations of method 800a and 800b may be calibrated by fitting a simulated depth profile (e.g., an electronic depiction) to a corresponding cross section of a physical or modeled wafer. Calibration may include adjusting one or more parameters described above (e.g., mask critical dimension offset 820, etch rate constant 822, short range factor 824, long range factor 826, ion intensity 830, a neutral intensity 832, a spread angle 834, re-deposition rate 840, or other parameters) based on similarities or differences between the simulated depth profile (or other electronic depictions) and the corresponding cross section of the physical wafer. The calibrated method (e.g., model) may be used to predict an etch profile (of a metrology target design as just one example), which may be fed to a simulation system such as design-for-control software (or other similar design software) to predict overlay (e.g., measured by Yieldstar (described above)) or other alignment signal performance. In some embodiments, the prediction can in turn be used to generate better designs of overlay or alignment marks in the design-for-control software. In an embodiment, determining the loading information, determining the flux information, determining the re-deposition information, determining the output etch profile, and/or or the calibration are performed iteratively 818 until the depth information corresponds to depths in an image and/or other electronic depictions (e.g., a model) of a corresponding layer of a physical wafer.

Figure 8C:
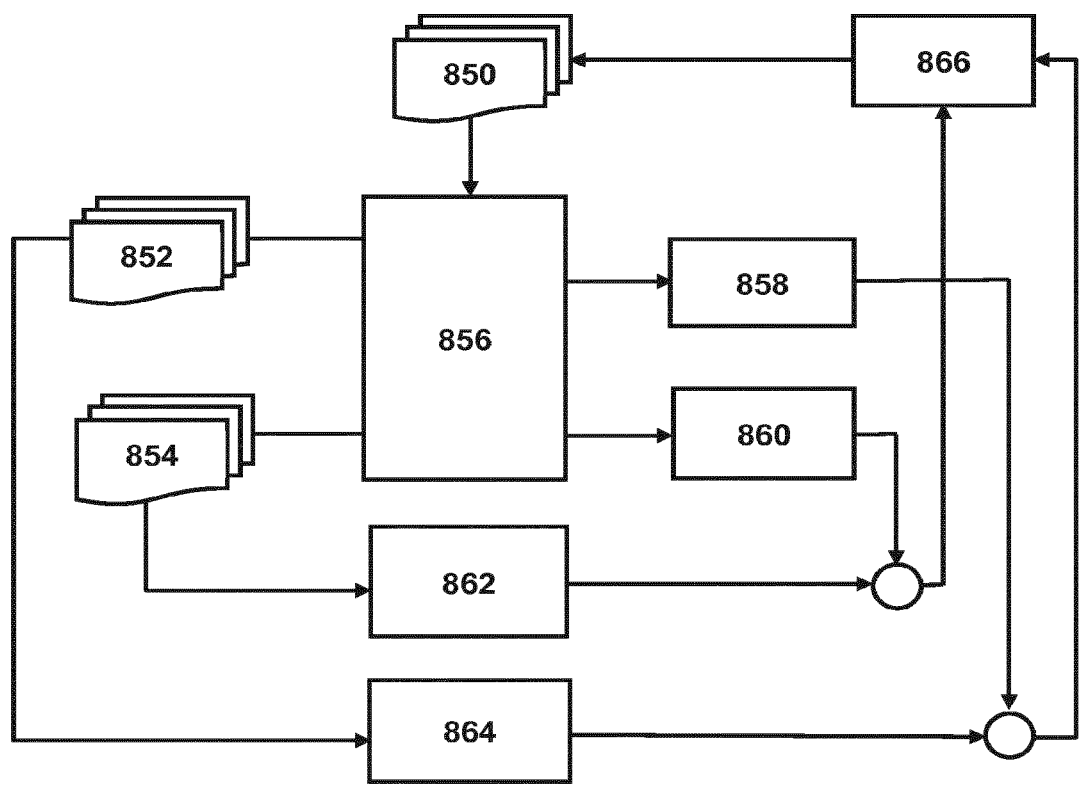
FIG. 8c is a diagram of an alternative method of calibration using a combination of overlay and alignment systems.

FIG. 8c is a diagram of an alternative method of calibration using a combination of overlay and alignment systems. The overlay and alignment systems may be replaced with an optical critical dimension (OCD) system (e.g., another scatterometry system), or SEM or E-beam systems, for example. The different measurement system may also be a combined system (e.g., calibration based on cross-sectional data, OCD data, and/or SEM data). As shown in FIG. 8c, model parameters 850, an alignment mark design 852, and an overlay target design 854 are fed into etch model 856. Etch model 856 outputs a wafer alignment simulation 858, and a wafer overlay simulation 860. These are used in combination with overlay measurement 862 data (based on overlay target design 854), and alignment measurement 864 data (based on alignment mark design 852) for model parameter calibration 866. The calibrated model parameters 850 are fed back into the model 856.

Figure 11:
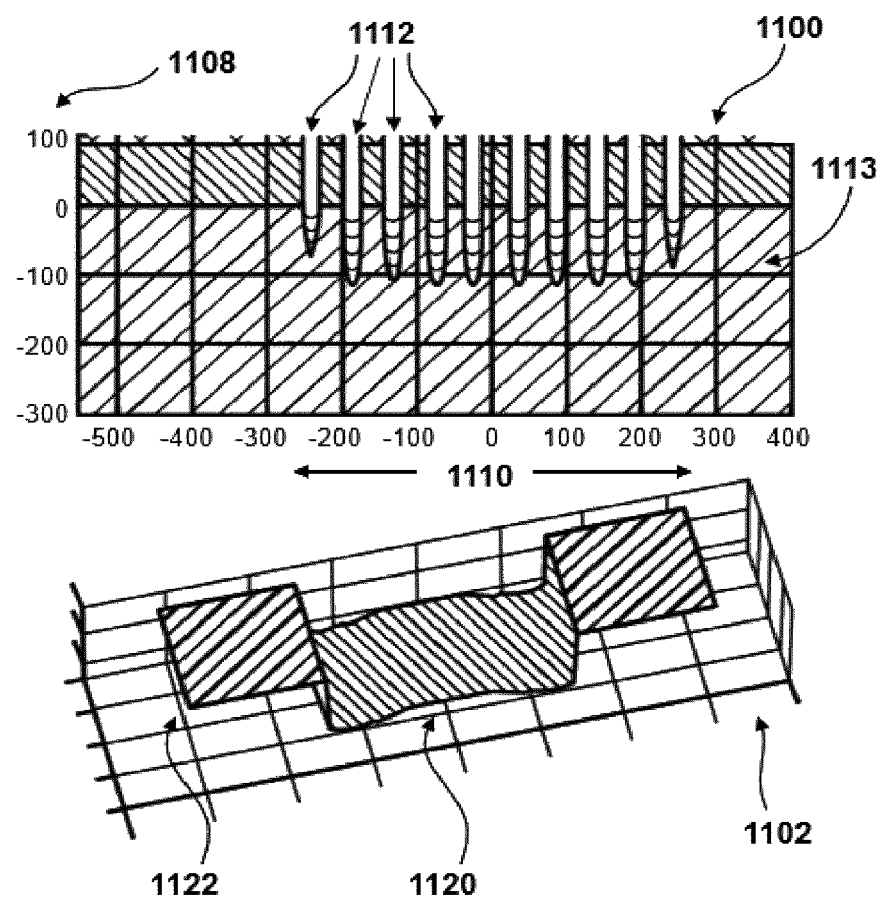
FIG. 11 illustrates electronic depictions of two different depth profiles generated using the system(s) and method(s) described herein, and corresponding scanning electron microscope (SEM) images of physical wafers, according to an embodiment.

FIG. 11 illustrates electronic depictions 1100 and 1102 of two different depth profiles generated using method 800a or 800b described above. As shown in FIG. 11, a variation in depth 1108 of various pockets 1112 across a planar dimension 1110 of a modeled wafer 1113 is reflected. A bow shape 1120 at a bottom edge of a depth profile 1122 modeled using the system(s) or method(s) described herein and shown in electronic depiction 1102 is reflected.

Figure 12:
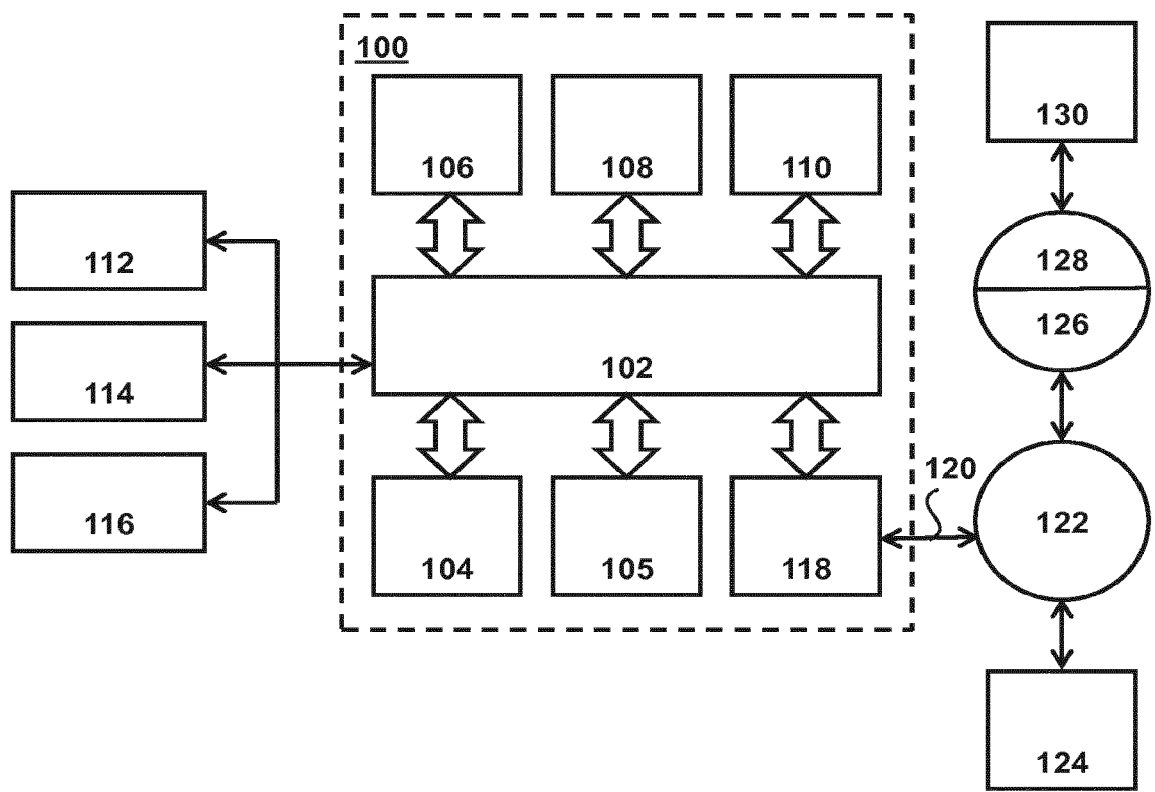
FIG. 12 is a block diagram of an example computer system, according to an embodiment.

FIG. 12 is a block diagram that illustrates a computer system 100 that can assist in implementing the methods, flows or the system(s) disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide all or part of a method described herein, for example. The received code may be executed by processor 104 as it is received, and/or stored in storage device 110, or other non-volatile storage for later execution. In this manner, computer system 100 may obtain application code in the form of a carrier wave.

Figure 13:
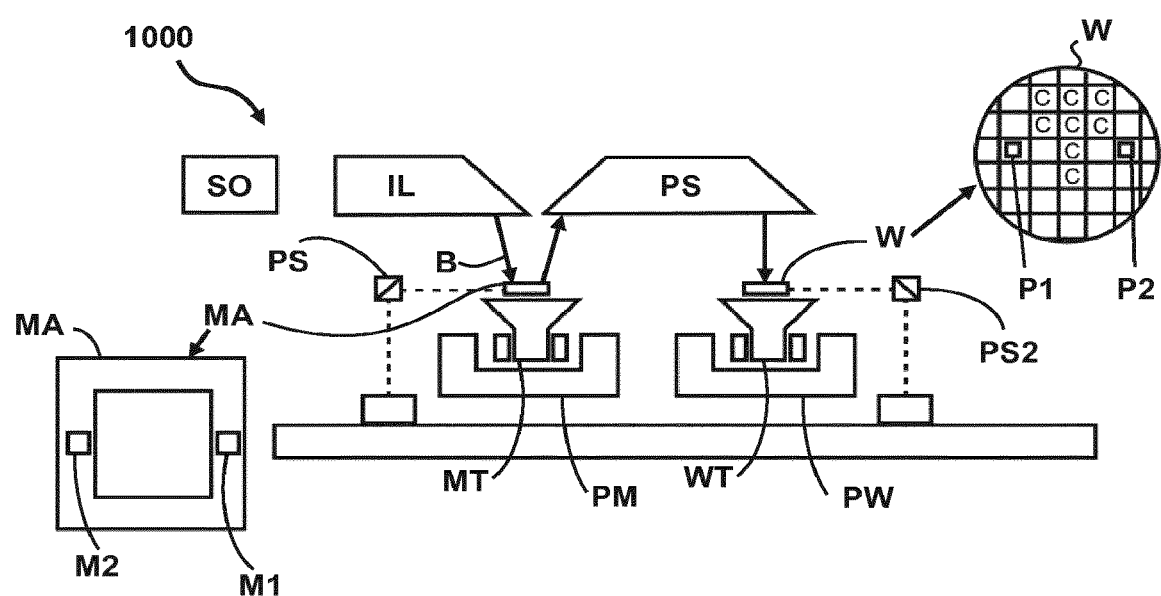
FIG. 13 is a schematic diagram of a lithographic projection apparatus similar to FIG. 1, according to an embodiment.

FIG. 13 schematically depicts an exemplary lithographic projection apparatus in conjunction with the techniques described herein can be utilized. The apparatus comprises:

an illumination system IL, to condition a beam B of radiation. In this particular case, the illumination system also comprises a radiation source SO;

a first object table (e.g., patterning device table) MT provided with a patterning device holder to hold a patterning device MA (e.g., a reticle), and connected to a first positioner to accurately position the patterning device with respect to item PS;

a second object table (substrate table) WT provided with a substrate holder to hold a substrate W (e.g., a resist-coated silicon wafer), and connected to a second positioner to accurately position the substrate with respect to item PS;

a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 13 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or F2 lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted. However, in the case of a stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed $V=Mv$, in which M is the magnification of the lens PL (typically, $M=\frac{1}{4}$ or $\frac{1}{5}$). In this manner, a relatively large target portion C can be exposed, without having to compromise on resolution.

Figure 14:
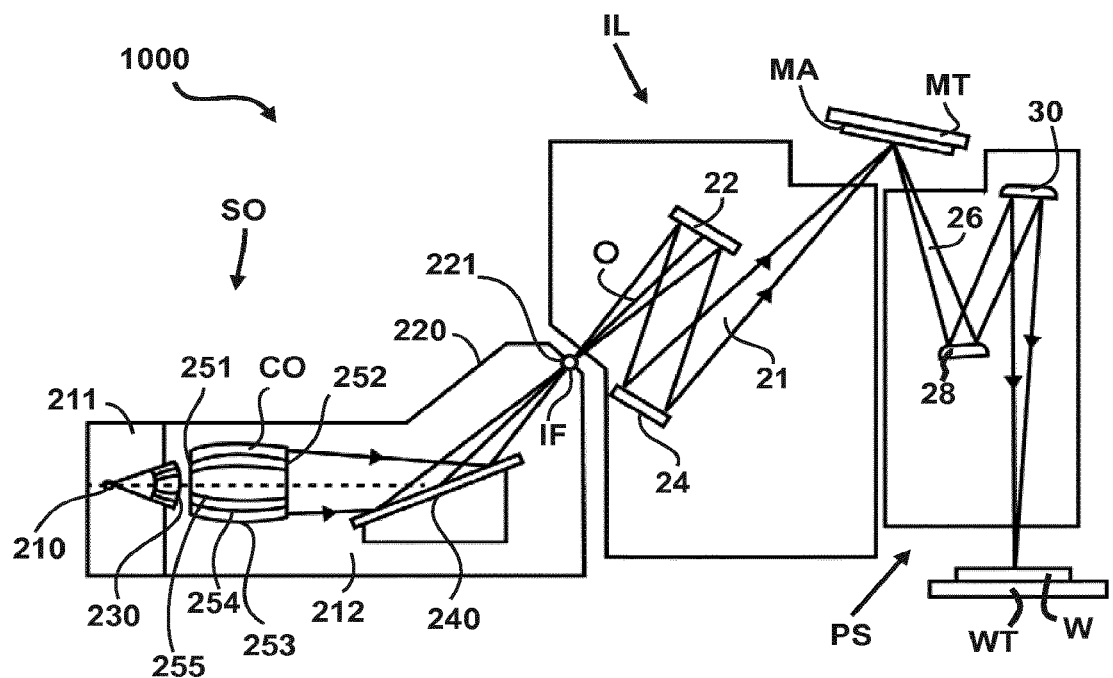
FIG. 14 is a more detailed view of the apparatus in FIG. 13, according to an embodiment.

FIG. 14 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 20.

Collector optic CO, as illustrated in FIG. 14, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 15:
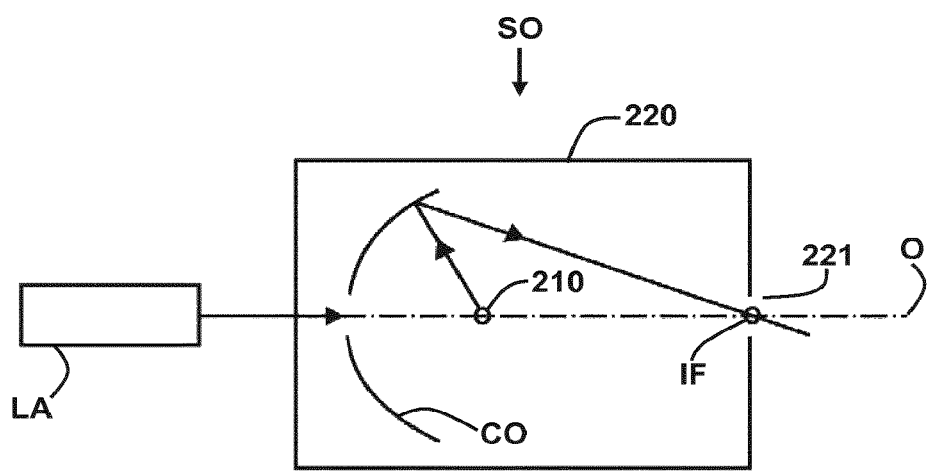
FIG. 15 is a more detailed view of the source collector module SO of the apparatus of FIG. 13 and FIG. 14, according to an embodiment.

Alternatively, the source collector module SO may be part of an LPP radiation system as shown in FIG. 15. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method for determining an etch profile of a layer of a wafer for a simulation system, the method comprising:
    determining a masking layer profile for the layer of the wafer;
    based at least in part on the masking layer profile:
        determining loading information for the masking layer profile, the loading information indicating dependence of an etch rate for the masking layer profile on a quantity and pattern of material being etched; and/or
        determining flux information for the masking layer profile, the flux information indicating dependence of the etch rate for the masking layer profile on an intensity and a spread angle of radiation incident on the masking layer profile; and/or
        determining re-deposition information for the masking layer profile, the re-deposition information indicating dependence of the etch rate for the masking layer profile on an amount of material removed from the masking layer profile that is re-deposited back on the masking layer profile; and
    determining an output etch profile for the layer of the wafer based on the loading information, the flux information, and/or the re-deposition information for the masking layer profile.
2. The method of clause 1, further comprising determining depth information based on the output etch profile for use during overlay determination.
3. The method of clause 2, wherein determining the loading information, determining the flux information, determining the re-deposition information, and/or determining the output etch profile are performed iteratively until the depth information corresponds to depths in an image of a corresponding layer of a physical wafer.
4. The method of clause 3, further comprising generating an electronic depiction of the layer of the wafer based on the depth information to facilitate a visual comparison between the electronic depiction and the image of the corresponding layer of the physical wafer.
5. The method of clause 3, further comprising generating an electronic depiction of the layer of the wafer based on the depth information to facilitate dimensional measurement of the electronic depiction for comparison to dimensions obtained from the image of the corresponding layer of the physical wafer.
6. The method of clause 1, further comprising calibrating parameters of operations of the method based on information from a metrology system for a corresponding layer of a physical and/or simulated wafer.
7. The method of clause 6, comprising calibrating parameters of operations of the method based on information from the metrology system for the corresponding layer of the simulated wafer, wherein the calibration further comprises adjusting wafer simulation parameters of the simulated wafer.

8. The method of any of clauses 1-7, wherein determining the masking layer profile, determining the loading information, determining the flux information, determining the re-deposition information, and/or determining the output etch profile are performed for a region of interest of the layer of the wafer.

9. The method of any of clauses 1-8, wherein the masking layer profile for the layer of the wafer comprises an after patterning profile.

10. The method of any of clauses 1-9, wherein the masking layer profile for the layer of the wafer comprises after develop inspection (ADI) dimensions.

11. The method of any of clauses 1-10, wherein determining the masking layer profile for the layer of the wafer comprises one or more of obtaining, designing, or measuring dimensions of the masking layer profile.

12. The method of any of clauses 1-11, further comprising simulating a trim operation on the masking layer profile according to a trim recipe, wherein simulating the trim operation on the masking layer profile comprises modifying dimensions of the masking layer profile.

13. The method of clause 12, wherein simulating the trim operation on the masking layer profile comprises adjusting a mask critical dimension (CD) offset.

14. The method of any of clauses 1-13, wherein determining the loading information for the masking layer profile comprises adjusting one or more of an etch rate constant, a short range loading factor, or a long range loading factor.

15. The method of any of clauses 1-14, wherein determining the flux information for the masking layer profile comprises adjusting one or more of an ion intensity, a neutral intensity, or a spread angle of the incident radiation.

16. The method of any of clauses 1-15, wherein determining the re-deposition information for the masking layer profile comprises adjusting a re-deposition rate for the masking layer profile.

17. The method of any of clauses 1-16, wherein:
determining the loading information comprises determining dependence of the etch rate at individual locations across the masking layer profile based on a quantity and pattern of material being etched at the individual locations;
determining the flux information comprises determining dependence of the etch rate at the individual locations across the masking layer profile based on an intensity and a spread angle of radiation incident on the masking layer profile at the individual locations; and
determining the re-deposition information comprises determining the dependence of the etch rate at the individual locations across the masking layer profile based on an amount of material removed from the masking layer profile at the individual locations that is re-deposited back on the masking layer profile at the individual locations.

18. The method of clause 17, wherein determining the dependence of the etch rate at the individual locations across the masking layer profile comprises determining individual loading factors for the individual locations.

19. The method of clause 18, wherein an individual loading factor is determined based on a Boolean function of a mask pattern at an individual location.

20. The method of clause 17, wherein the flux information is determined based on one or more bias constants, one or more fitting constants, short range loading factors, and long range loading factors that correspond to individual locations.

21. The method of clause 17, wherein the re-deposition information is determined based on one or more bias constants, long range fitting factors, and long range loading factors that correspond to individual locations.

22. The method of any of clauses 1-21, wherein the mask layer profile is an after-development inspection profile.

23. The method of clause 22, wherein the after-development profile is obtained from a resist image.

24. The method of clause 22 or clause 23, wherein the after-development profile is constructed based on a contour extracted from the resist image.

25. The method of any of clauses 22-24, wherein the after-development profile is obtained by measurement or patterning process simulation.

26. The method of any of clauses 22-25, wherein the after-development profile contains 3 dimensional information and stochastic information with regard to a feature.

27. The method of any of clauses 1-26, further comprising:
constructing a device stack by using the output etch profile; and
feeding the constructed stack to a metrology simulation process to predict metrology signals.

28. The method of clause 27, further comprising determining a design of an overlay and/or an alignment mark based on the predicted metrology signal.

29. A computer program product comprising a non-transitory computer readable medium having instructions recorded thereon, the instructions when executed by a computer implementing the method of any of clauses 1-28.

30. A method for etch model application to generate a metrology target design, the method comprising:
calibrating the etch model using experimental cross-section profile information from a layer of a physical wafer generated based on the etch model;
predicting an etch depth profile of a layer of a modeled wafer based on the calibrated etch model; and
using the predicted etch depth profile in rigorous coupled-wave analysis (RCWA) to enhance the metrology target design.

31. The method of clause 30, wherein predicting the etch depth profile of the layer of the modeled wafer based on the calibrated etch model comprises:
determining (i) a starting resist profile for the layer of the wafer and (ii) a resist trim etching recipe;
determining a trimmed resist profile by simulating a trim operation on the starting resist profile according to the resist trim etching recipe,
based at least in part on the trimmed resist profile:
determining loading information for the trimmed resist profile, the loading information indicating dependence of an etch rate for the trimmed resist profile on a quantity and pattern of material being etched; and/or
determining flux information for the trimmed resist profile, the flux information indicating dependence of the etch rate for the trimmed resist profile on an intensity and a spread angle of radiation incident on the trimmed resist profile; and/or
determining re-deposition information for the trimmed resist profile, the re-deposition information indicating dependence of the etch rate for the trimmed resist profile on an amount of material removed from the trimmed resist profile that is re-deposited back on the trimmed resist profile; and determining an output etch depth profile for the layer of the wafer based on the loading information, the flux information, and/or the re-deposition information for the trimmed resist profile.

32. The method of any of clause 30 or clause 31, wherein enhancing the metrology target design comprises adjusting one or more dimensions and/or a pattern of the metrology target design.

33. The method of any of clauses 30-32, wherein the experimental cross-section profile information comprises visual or dimensional comparisons between an electronic image of the layer of the physical wafer and a corresponding electronic depiction of the layer generated using the model.

34. A computer program product comprising a non-transitory computer readable medium having instructions recorded thereon, the instructions when executed by a computer implementing the method of any of clauses 30-33.

35. A method for etch model application to calibrate a two dimension etch model for optical proximity correction applications, the method comprising:

calibrating the etch model using any combination of cross-section profile, scanning electron microscope, and scatterometry measurements from a layer of a simulated wafer generated based on a corresponding etch process;

predicting etch biases of a plurality of patterns in the layer of the modeled wafer based on the calibrated etch model; and using the predicted etch biases to correct a photomask, verify a post-etch process window, or co-optimize a lithography source and photomask.

36. A computer program product comprising a non-transitory computer readable medium having instructions recorded thereon, the instructions when executed by a computer implementing the method of clause 35.

37. A method for etch model application to calibrate an etch model for predicting a cross-wafer etch fingerprint as input for wafer inspection or patterning control operations, the method comprising:

calibrating the etch model with parameters that describe cross wafer variations of a corresponding etch process using any combination of a cross-wafer cross-section profile, scanning electron microscope, and scatterometry measurements from a layer of a simulated wafer generated based on the etch process;

predicting an etch bias of a plurality of patterns of the layer of the modeled wafer based on the calibrated etch model; and using the predicted etch bias as input for defect prediction of an inspection system, or to a pattern fidelity control system to improve across wafer patterning performance.

38. A computer program product comprising a non-transitory computer readable medium having instructions recorded thereon, the instructions when executed by a computer implementing the method of clause 37.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:

1. A method comprising:

determining a masking layer profile for a layer of a wafer, wherein the masking layer profile is an after-development inspection profile that corresponds to a target profile;

based at least in part on the masking layer profile:

determining loading information for the masking layer profile, the loading information indicating dependence of an etch rate for the masking layer profile on a quantity and pattern of material being etched; and/or determining flux information for the masking layer profile, the flux information indicating dependence of an etch rate for the masking layer profile on an intensity and a spread angle of radiation incident on the masking layer profile; and/or determining re-deposition information for the masking layer profile, the re-deposition information indicating dependence of an etch rate for the masking layer profile on an amount of material removed from the masking layer profile that is re-deposited back on the masking layer profile; and determining, by a hardware computer system, an output etch profile for the layer of the wafer based on the loading information, the flux information, and/or the re-deposition information.

2. The method of claim 1, further comprising determining depth information based on the output etch profile for use during overlay determination, and/or wherein determining the loading information, determining the flux information, determining the re-deposition information, and/or determining the output etch profile are performed iteratively to produce depth information that corresponds to depths in an image of a corresponding layer of a physical wafer.

3. The method of claim 2, further comprising generating an electronic depiction of the layer of the wafer based on the depth information to facilitate a visual comparison between the electronic depiction and an image of the corresponding layer of the physical wafer.

4. The method of claim 2, further comprising generating an electronic depiction of the layer of the wafer based on the depth information to facilitate dimensional measurement of the electronic depiction for comparison to one or more dimensions obtained from an image of the corresponding layer of the physical wafer.

5. The method of claim 1, further comprising calibrating one or more parameters of operations of the method based on information from a metrology system for a corresponding layer of a physical and/or simulated wafer, wherein the calibration further comprises adjusting one or more wafer simulation parameters.

6. The method of claim 1, wherein determining the masking layer profile, determining the loading information, determining the flux information, determining the re-deposition information, and/or determining the output etch profile are performed for a region of interest of the layer of the wafer.

7. The method of claim 1, wherein the masking layer profile for the layer of the wafer comprises an after patterning profile.

8. The method of claim 1, further comprising simulating a trim operation on the masking layer profile according to a trim recipe, wherein simulating the trim operation on the masking layer profile comprises modifying dimensions of the masking layer profile, and wherein simulating the trim operation on the masking layer profile comprises adjusting a mask critical dimension (CD) offset and/or roughness tuning.

9. The method of claim 1, comprising determining the loading information for the masking layer profile, wherein determining the loading information for the masking layer profile comprises adjusting one or more selected from: an etch rate constant, a short range loading factor, or a long range loading factor.

10. The method of claim 1, comprising determining the flux information for the masking layer profile, wherein determining the flux information for the masking layer profile comprises adjusting one or more selected from: an ion intensity, a neutral intensity, or a spread angle of the incident radiation, and/or
comprising determining the re-deposition information for the masking layer profile, wherein determining the re-deposition information for the masking layer profile comprises adjusting a re-deposition rate for the masking layer profile.

11. The method of claim 1, wherein the after-development profile is obtained by measurement or patterning process simulation.

12. The method of claim 1, wherein the after-development profile is obtained from a resist image resulting from a patterning process simulation that is performed with regard to the target profile.

13. The method of claim 1, wherein the after-development profile is constructed based on a contour from a resist image.

14. The method of claim 1, further comprising:
constructing a device stack by using the output etch profile; and
feeding the constructed device stack to a metrology simulation process to predict a metrology signal.

15. The method of claim 14, further comprising determining a design of an overlay and/or an alignment mark based on the predicted metrology signal.

16. A computer program product comprising a non-transitory computer-readable medium having instructions therein, the instructions, upon execution by a computer system, configured to cause the computer system to at least:
determine a masking layer profile for a layer of a wafer, wherein the masking layer profile is an after-development inspection profile that corresponds to a target profile;
based at least in part on the masking layer profile:
determine loading information for the masking layer profile, the loading information indicating dependence of an etch rate for the masking layer profile on a quantity and pattern of material being etched; and/or
determine flux information for the masking layer profile, the flux information indicating dependence of an etch rate for the masking layer profile on an intensity and a spread angle of radiation incident on the masking layer profile; and/or
determine re-deposition information for the masking layer profile, the re-deposition information indicating dependence of an etch rate for the masking layer profile on an amount of material removed from the masking layer profile that is re-deposited back on the masking layer profile; and
determine an output etch profile for the layer of the wafer based on the loading information, the flux information, and/or the re-deposition information.

17. The computer program product of claim 16, wherein the instructions are further configured to cause the computer system to determine depth information based on the output etch profile for use during overlay determination, and/or configured to cause the computer system to perform the determination of the loading information, the determination of the flux information, the determination of the re-deposition information, and/or the determination of the output etch profile iteratively to produce depth information that corresponds to depths in an image of a corresponding layer of a physical wafer.

18. The computer program product of claim 16, wherein the after-development profile is obtained from a resist image resulting from a patterning process simulation that is performed with regard to the target profile.

19. The computer program product of claim 16, wherein the after-development profile is constructed based on a contour from a resist image.

20. The computer program product of claim 16, wherein the instructions are further configured to cause the computer system to:
construct a device stack by using the output etch profile; and
feed the constructed device stack to a metrology simulation process to predict metrology signals, the metrology simulation process including an optical model and a resist model.

* * * * *